(12) United States Patent
Kato

(10) Patent No.: US 7,714,633 B2
(45) Date of Patent: May 11, 2010

(54) LIMITER AND SEMICONDUCTOR DEVICE USING THE SAME

(75) Inventor: Kiyoshi Kato, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 0 days.

(21) Appl. No.: 10/593,577

(22) PCT Filed: Apr. 6, 2005

(86) PCT No.: PCT/JP2005/007115

§ 371 (c)(1),
(2), (4) Date: Sep. 20, 2006

(87) PCT Pub. No.: WO2005/098955

PCT Pub. Date: Oct. 20, 2005

(65) Prior Publication Data

US 2007/0272759 A1   Nov. 29, 2007

(30) Foreign Application Priority Data

Apr. 9, 2004   (JP) ............................. 2004-115467

(51) Int. Cl.
*H03K 5/00* (2006.01)
*H01L 23/62* (2006.01)

(52) U.S. Cl. .................. 327/309; 327/321; 257/360

(58) Field of Classification Search .................. 327/309, 327/312, 321, 306; 257/316, 360
See application file for complete search history.

(56) References Cited

U.S. PATENT DOCUMENTS

| 5,210,436 | A | 5/1993 | Kakizoe et al. |
| 6,300,656 | B1 * | 10/2001 | Ueno et al. .................. 257/315 |
| 6,433,382 | B1 * | 8/2002 | Orlowski et al. ............ 257/315 |
| 6,670,679 | B2 * | 12/2003 | Hirata ......................... 257/360 |
| 6,671,146 | B1 | 12/2003 | Hashimoto et al. |
| 6,972,662 | B1 | 12/2005 | Ohkawa et al. |
| 2002/0195648 | A1 | 12/2002 | Hirata |

FOREIGN PATENT DOCUMENTS

| CN | 1297580 | 5/2001 |
| CN | 1404149 | 3/2003 |
| EP | 0 470 371 | 2/1992 |
| EP | 0 987 763 | 3/2000 |
| JP | 53-126567 | 10/1978 |
| JP | 2001-250097 | 9/2001 |

(Continued)

OTHER PUBLICATIONS

Search Report (Application No. 05730701.9) dated Aug. 27, 2008.

(Continued)

*Primary Examiner*—Dinh T. Le
(74) *Attorney, Agent, or Firm*—Eric J. Robinson; Robinson Intellectual Property Law Office, P.C.

(57) ABSTRACT

By using a stacked gate transistor including a floating gate in a limiter, a threshold voltage $V_{th}$ of the stacked gate transistor can be corrected by controlling the amount of charge accumulated in the floating gate of the stacked gate transistor even in the case where there are variations in the threshold voltage $V_{th}$ of the stacked gate transistor.

28 Claims, 21 Drawing Sheets

FOREIGN PATENT DOCUMENTS

WO       WO 00/44049       7/2000

OTHER PUBLICATIONS

International Search Report (Application No. PCT/JP2005/007115) dated Jul. 26, 2005.

Written Opinion (Application No. PCT/JP2005/007115) dated Jul. 26, 2005.

Office Action (Application No. 200580012273.7) Dated Jun. 6, 2008.

* cited by examiner $Vcg-Vs \geqq Vwe$ $Vwh < Vcg-Vs < Vwe$ $Vcg-Vs \leqq Vwh$

LIMITER AND SEMICONDUCTOR DEVICE USING THE SAME

TECHNICAL FIELD

The present invention relates to a limiter formed by using a thin semiconductor film. More particularly, the invention relates to a semiconductor device using the limiter, which is capable of wireless communication.

BACKGROUND ART

A semiconductor device such as an ID chip or an IC card capable of wirelessly communicating data has been put into practical use in various fields, and is expected to further expand its market as a new type of communication information terminal. The ID chip is also called a wireless tag, an RFID (Radio Frequency Identification) tag, or an IC tag. The ID chip and the IC card that are in practical use today each has an antenna and an integrated circuit formed by using a semiconductor substrate.

The ID chip or the IC card can communicate with a reader/writer via radio waves. Specifically, an integrated circuit operates using an AC voltage generated in an antenna by radio waves emitted from the reader/writer and a signal outputted from the integrated circuit is used for load modulation of the antenna, thereby a signal can be transmitted to the reader/writer.

DISCLOSURE OF INVENTION

The intensity of radio waves emitted from a reader/writer is determined by standard; therefore, an AC voltage amplitude generated in an antenna of an ID chip or an IC card is generally within a predetermined range. However, an excessive AC voltage over a predetermined range occurs in an antenna, if the ID chip or the IC card is exposed to large amplitude radio waves over the standard due to, for example, undesired radiation from an external electronic apparatus. When a current flowing in a semiconductor element of an integrated circuit increases rapidly with this excessive AC voltage, the integrated circuit may be broken due to dielectric breakdown.

Particularly in recent years, the withstand voltage of a semiconductor element tends to decrease due to miniaturization thereof. Therefore, an ID chip or an IC card provided with an overcurrent protection circuit is extremely effective to improve the reliability thereof. A limiter is an amplitude limiter that holds an outputted voltage to no more than a predetermined voltage (limit voltage) regardless of an inputted voltage, which is one of the circuits used for the aforementioned overcurrent protection.

FIG. 20A is a circuit diagram showing a general example of a limiter. Reference numeral 1901 denotes a resistor, and 1902 denotes a transistor of which gate (G) and drain (D) are connected to each other (diode connected). A voltage Vin from an input terminal is supplied to a first terminal of two terminals of the resistor 1901. The gate and the drain of the transistor 1902 are connected to a second terminal of the resistor 1901, and a source (S) thereof is supplied with a constant voltage such as a ground (GND). A voltage at the second terminal of the resistor 1901 corresponds to a voltage Vout at an output terminal of the limiter.

According to the aforementioned configuration, a forward bias current flows in the transistor 1902 even if an excessive voltage Vin is inputted from the input terminal, and thus a voltage Vout at the output terminal can be held to no more than a limit voltage. However, since this limit voltage depends on characteristics of the diode-connected transistor, it is difficult to control the limit voltage with accuracy.

FIG. 20B shows a relation between a drain-source voltage Vds and a drain current Id of the transistor 1902. A forward drop voltage Vf depends on a threshold voltage Vth of the transistor 1902. In the case of the limiter shown in FIG. 20A, the limit voltage is equal to the forward drop voltage Vf, therefore, variations in threshold voltages Vth have a direct effect on variations in limit voltages.

Accordingly, when characteristics of the transistor 1902 vary, it becomes difficult to control the voltage Vout at the output terminal of the limiter with accuracy, an integrated circuit cannot operate with desired specifications, and the integrated circuit may even be broken due to dielectric breakdown.

Further, a semiconductor substrate used for forming an integrated circuit is more expensive, less flexible, and lower in mechanical strength as compared with a glass substrate and the like. The mechanical strength can be increased to some extent by reducing the area of the integrated circuit itself. In such a case, however, it is difficult to maintain the circuit scale and applications of an ID chip or an IC card are limited. Accordingly, if emphasis is placed on maintaining the circuit scale of the integrated circuit, the area of the integrated circuit cannot be reduced too much, which limits the increase in the mechanical strength.

In view of the above, the invention provides a limiter capable of controlling a limit voltage with accuracy. The invention also provides a semiconductor device capable of controlling a limit voltage with accuracy. Further, the invention provides a semiconductor device using the limiter, in which the mechanical strength of an integrated circuit can be increased while maintaining the circuit scale. Moreover, the invention provides an inexpensive semiconductor device.

A limiter of the invention is characterized by using as a diode a stacked gate transistor having a floating gate.

More specifically, the limiter of the invention is characterized by having a semiconductor including a pair of impurity regions, a first insulating film formed on the semiconductor, a first electrode (floating gate) formed over a region sandwiched between the pair of impurity regions of the semiconductor with the first insulating film (first gate insulating film) interposed therebetween, a second insulating film (second gate insulating film) formed on the first electrode, and a second electrode (control gate) formed over the first electrode with the second insulating film interposed therebetween. Further, the limiter of the invention is characterized in that one of the pair of impurity regions is electrically connected to the second electrode.

According to a transistor having a floating gate, variations in the threshold voltages Vth of the transistor can be corrected by controlling the amount of charge accumulated in the floating gate.

A semiconductor device of the invention, such as an ID chip or an IC card, is characterized by having an integrated circuit provided with the aforementioned limiter. If a thin film transistor (TFT) is used as a transistor, circuits in the integrated circuit as well as the limiter are also made from a semiconductor element formed by using a thin semiconductor film.

The semiconductor device of the invention may include an antenna in addition to the integrated circuit. The integrated circuit operates using an AC voltage generated in the antenna and transmit a signal to a reader/writer by modulating an AC voltage induced in the antenna. The antenna and the integrated circuit may be formed over the same substrate, or the antenna may be formed separately from the integrated circuit and then connected thereto. Such an ID chip in which the antenna and the integrated circuit are formed over the same substrate is also called a wireless chip.

The integrated circuit may be formed directly on a substrate, or may be attached to another substrate after being formed on the substrate. It is preferable that the integrated circuit is attached to another substrate by a method selected from various methods such as a method where a metal oxide film is formed between a highly heat resistant substrate and the integrated circuit and the metal oxide film is weakened by crystallization to detach the integrated circuit from the substrate and then attach it to another substrate, a method where a peeling layer is formed between a highly heat resistant substrate and the integrated circuit and the peeling layer is removed by laser irradiation or etching to detach the integrated circuit from the substrate and then attach it to another substrate, and a method where a highly heat resistant substrate on which the integrated circuit is formed is removed mechanically or by etching using solution or gas to remove the integrated circuit from the substrate and then attach it to another substrate.

Alternatively, integrated circuits formed separately may be stacked by attaching them to each other, thereby circuit scale and memory capacitance are increased. Since an integrated circuit using a thin semiconductor film is significantly reduced in thickness as compared with an integrated circuit formed on a semiconductor substrate, a plurality of integrated circuits may be stacked while maintaining the mechanical strength of the whole integrated circuits to some extent. Stacked integrated circuits may be connected to each other by a known method such as flip chip bonding, TAB (Tape Automated Bonding), and wire bonding.

The invention further includes a packaging material, a tag, a certificate, a bill, and securities, each of which uses the aforementioned ID chip. The packaging material in the invention corresponds to a support shapable or shaped to wrap an object, such as plastic wrap, plastic bottle, tray, and capsule. The tag in the invention corresponds to a tag attached to an object and having data on the object, such as shipping tag, price tag, and name tag. The certificate in the invention corresponds to a document stating that a fact is true, such as a family register, a resident card, a passport, a license, an identification card, a membership card, a credit card, a cash card, a prepaid card, a patient's registration card, and a commuter pass. The securities in the invention correspond to securities stating private property rights, such as a bill of exchange, a check, a receipt note, a bill of lading, a warehouse receipt, a stock, a bond, a gift certificate, and a mortgage certificate.

According to the limiter of the invention, it is preferable that the limit voltage is controlled with accuracy, by using as a diode a transistor having a floating gate, by correcting variations in the threshold voltages Vth of the transistor, and eventually correcting variations in the forward drop voltages Vf. Particularly in the case of using TFTs, a semiconductor device can be formed without using an expensive semiconductor substrate, though variations in the characteristics of the TFTs are larger than those of transistors formed on a semiconductor substrate. According to the limiter of the invention, however, it is preferable that the limit voltage is controlled with accuracy even when using a TFT that is formed by using an inexpensive substrate.

In the semiconductor device of the invention such as an ID chip or an IC card, the aforementioned limiter is provided in an integrated circuit, therefore, an accurate limit voltage may be obtained. Thus, the integrated circuit operates with desired specifications and may be prevented from being broken due to dielectric breakdown. Moreover, when circuits in the integrated circuit as well as the limiter are also made from a semiconductor element formed by using a thin semiconductor film, that is, the semiconductor device may be formed by using an inexpensive substrate. Accordingly, cost reduction of the semiconductor device may be achieved If an integrated circuit is made by using a semiconductor element formed from a thin semiconductor film, it is desirable that an increased mechanical strength is obtained by using a flexible substrate without making the area of the integrated circuit as small as that of an integrated circuit using a semiconductor substrate. As a result, the mechanical strength of the integrated circuit may be increased while maintaining the circuit scale, leading to a wider application range of the semiconductor device such as an ID chip or an IC card.

BEST MODE FOR CARRYING OUT THE INVENTION

Although the present invention will be fully described by way of Embodiment Modes with reference to the accompanying drawings, it is to be understood that various changes and modifications will be apparent to those skilled in the art. Therefore, unless such changes and modifications depart from the scope of the invention hereinafter defined, they should be construed as being included therein.

Figure 1A:
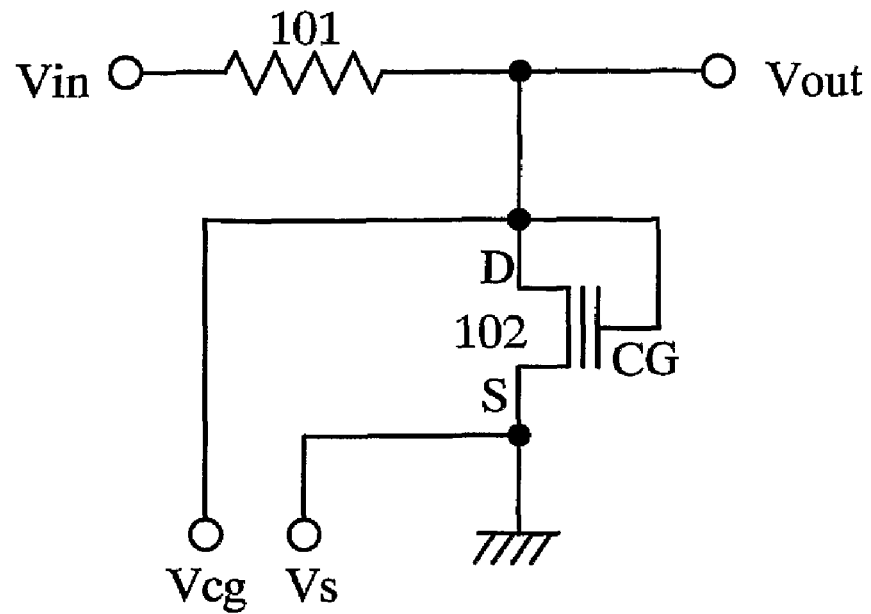
FIG. 1A is a circuit diagram of a limiter of the invention and FIG. 1B is a diagram showing the relation between a drain-source voltage Vds and a drain current Id of a transistor 102.

FIG. 1A is a circuit diagram showing an example of a limiter of the invention, which limits the maximum value of a voltage Vin from an input terminal. Reference numeral 101 denotes a resistor, and 102 denotes a diode-connected transistor. The transistor 102 used in the invention has two gates of a floating gate (FG) and a control gate (CG), and the diode-connected transistor means a transistor of which control gate and drain (D) are connected to each other.

A voltage Vin from the input terminal is supplied to a first terminal of two terminals of the resistor 101. A second terminal of the resistor 101 is connected to a source or a drain of the transistor 102. Specifically, since the transistor 102 is an N-channel transistor in FIG. 1A, the control gate and the drain thereof are connected to the second terminal of the resistor 101, and the source (S) of the transistor 102 is supplied with a constant voltage such as a ground (GND). On the other hand, if the transistor 102 is a P-channel transistor, the source thereof is connected to the second terminal of the resistor 101, and the control gate and the drain of the transistor 102 are supplied with a constant voltage such as a ground (GND). A voltage at the second terminal of the resistor 101 corresponds to a voltage Vout at an output terminal of the limiter.

According to the aforementioned configuration, a forward drop voltage of the diode formed by the transistor 102 holds a voltage Vout at the output terminal to no more than a limit voltage even if an excessive voltage Vin is inputted from the input terminal. This limit voltage depends on a forward drop voltage of the diode-connected transistor 102.

The limiter of the invention does not necessarily include the resistor 101. In such a case, the voltage Vin from the input terminal is supplied directly to the control gate and the drain of the transistor 102, and a control gate-drain voltage dropped by the transistor 102 is supplied to a circuit in the subsequent stage as the voltage Vout at the output terminal of the limiter.

Figure 1B:
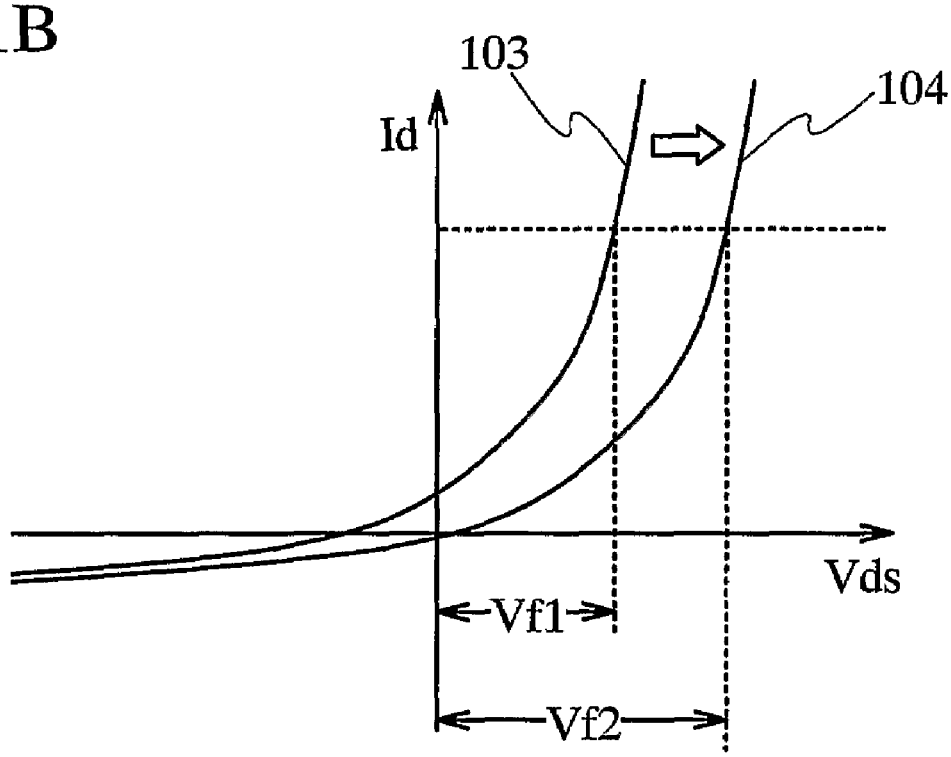

FIG. 1B shows the relation between a drain-source voltage Vds and a drain current Id of the transistor 102. In FIG. 1B, a graph 103 shows the relation between the voltage Vds and the drain current Id in an initial state where no charge is accumulated in the floating gate. Meanwhile, a graph 104 shows the relation between the voltage Vds and the drain current Id in a state after the correction where charge is accumulated in the floating gate. Note that Vf1 is a forward drop voltage of the transistor 102 in the initial state and Vf2 is a forward drop voltage of the transistor 102 in the state after the correction.

The forward drop voltage depends on a threshold voltage Vth of the transistor 102. According to the invention, the threshold voltage Vth of the transistor 102 is shifted by accumulating charge in the floating gate, thereby the forward drop voltage can be increased from Vf1 to Vf2 as shown in the graphs 103 and 104. According to the invention, the forward drop voltage can also be reduced by accumulating charge in the floating gate.

The amount of charge accumulated in the floating gate can be controlled by a voltage (gate voltage) between the control gate and the source. The relation between the gate voltage and the amount of charge is described with reference to FIGS. 2A to 2C.

Figure 2A:
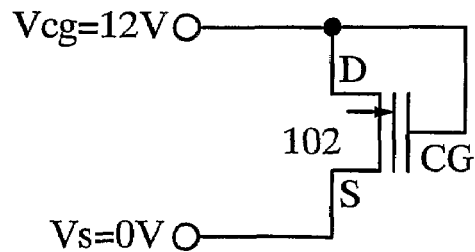
FIGS. 2A to 2C are diagrams showing the relation between a gate voltage and the amount of charge with reference to a circuit diagram of the transistor 102.

FIG. 2A is a circuit diagram of the transistor 102 in the case of shifting the threshold voltage Vth to the positive side. A voltage Vcg corresponds to a voltage supplied to the control gate whereas a voltage Vs corresponds to a voltage supplied to the source. In FIG. 2A, there is a difference between the voltage Vcg and the voltage Vs large enough to accumulate negative charge in the floating gate by hot electron injection or tunnel current. On the assumption that negative charge can be accumulated by hot electron injection or tunnel current at a gate voltage Vwe, the voltage Vcg and the voltage Vs may be set so that Vcg−Vs=Vwe is satisfied. In FIG. 2A, the voltage Vgs is 12 V and the voltage Vs is 0 V, for example.

As shown in FIG. 2A, negative charge is accumulated in the floating gate of the transistor 102 by hot electron injection or tunnel current, thereby the threshold voltage of the transistor 102 can be shifted to the positive side.

If the threshold voltage of the transistor 102 before being corrected is unknown or it is uncertain how much the threshold voltage was shifted by hot electron injection or tunnel current, the threshold voltage after the correction can be read to determine if the value is within a predetermined range.

Figure 2B:
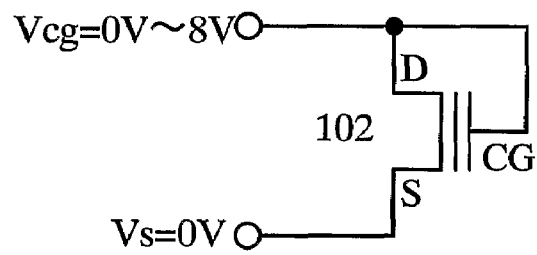

FIG. 2B is a circuit diagram of the transistor 102 in the case of reading the corrected threshold voltage Vth or limit voltage. In FIG. 2B, the difference between the voltage Vcg and the voltage Vs varies in the range where the amount of charge accumulated in the floating gate does not change. The transistor 102 is turned on when Vcg−Vs is equal to the corrected threshold voltage or more. Therefore, by measuring a drain current of the transistor 102 every time the value of Vcs−Vs varies, it can be determined if the corrected threshold voltage is within the predetermined range.

On the assumption that the negative charge accumulated in the floating gate by tunnel current can be pulled out at a gate voltage Vwh, the voltage Vcg and the voltage Vs may be set specifically in the range where Vwh<(Vcg−Vs)<Vwe is satisfied. In FIG. 2B, the voltage Vcg is 0 to 8 V and the voltage Vs is 0 V, for example.

If the corrected threshold voltage is on the negative side than the predetermined range, the threshold voltage can be shifted to the positive side to be within the predetermined range by performing the operation shown in FIG. 2A again. On the other hand, if the corrected threshold voltage is on the positive side than the predetermined range, the threshold voltage can be shifted to the negative side to be within the predetermined range by pulling out the negative charge accumulated in the floating gate by tunnel current.

Figure 2C:
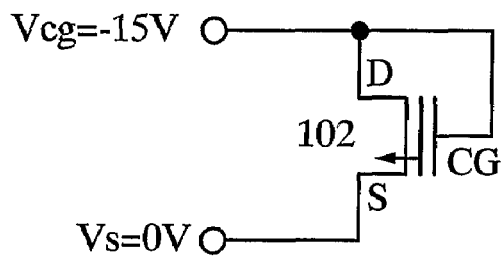

FIG. 2C is a circuit diagram of the transistor 102 in the case of correcting the threshold voltage Vth to the negative side. In FIG. 2C, there is a difference between the voltage Vcg and the voltage Vs large enough to pull out the negative charge accumulated in the floating gate by tunnel current. Specifically, the voltage Vcg and the voltage Vs may be set so that Vcg−Vs=Vwh is satisfied. In FIG. 2C, the voltage Vcg is −15 V and the voltage Vs is 0 V, for example.

As shown in FIG. 2C, the negative charge accumulated in the floating gate of the transistor 102 is pulled out to reduce the amount of the negative charge accumulated in the floating gate, thereby the threshold voltage of the transistor 102 can be shifted to the negative side.

In this embodiment mode, the threshold voltage of the transistor is shifted to the positive side and then to the negative side if necessary, though the invention is not limited to this. For example, the threshold voltage of the transistor may be shifted only to the negative side as shown in FIG. 2C.

Although the transistor used as a diode is an N-channel transistor in FIGS. 1A and 1B and FIGS. 2A to 2C, the invention is not limited to this. The limiter of the invention can use a P-channel transistor as a diode as well. However, the case of using a P-channel transistor as the transistor 102 is different from the case of using an N-channel transistor in that the transistor 102 can be turned on when Vcg−Vs is equal to the corrected threshold voltage or less.

In the case where the threshold voltage of the transistor 102 is corrected as shown in FIGS. 2A and 2C, the amount of change in the threshold voltage depends on the time for correction as well as the gate voltage. Accordingly, the threshold voltage of the transistor 102 is desirably corrected by controlling the time for correction as well as the gate voltage.

Although only one diode-connected transistor is provided in the limiter in FIGS. 1A and 1B and FIGS. 2A to 2C, the invention is not limited to this. The limiter of the invention may include a plurality of diode-connected transistors that are connected in series, and one of which connected at the end is connected to a resistor. In such a case, the limit voltage is equal to the sum of the forward drop voltage Vf of each transistor.

The voltage Vcg and the voltage Vs can be controlled by providing in a semiconductor device a connecting terminal connected to the control gate, the source, or the drain of the transistor 102 and by controlling the voltage of the connecting terminal from outside the semiconductor device. Alternatively, a circuit for controlling the voltage of the control gate, source, or drain of the transistor 102 may be provided inside the semiconductor device.

Described in FIGS. 1A and 1B and FIGS. 2A to 2C is an example of the limiter of the invention, which limits the maximum value of the voltage Vin from the input terminal, though the invention is not limited to this. The limiter of the invention may have a function of limiting the minimum value of the voltage Vin from the input terminal. If an N-channel transistor is used in this case, the source thereof is connected to the second terminal of the resistor and the control gate and the drain thereof are supplied with a constant voltage such as Vdd (Vdd>GND). Meanwhile, if a P-channel transistor is used, the control gate and the drain thereof are connected to the second terminal of the resistor and the source thereof is supplied with a constant voltage such as Vdd.

Also in the case of the limiter that limits the minimum value of the voltage Vin from the input terminal, the relation between the voltages Vcg, Vs, Vwe, and Vwh in the operations of correcting and reading may be set similarly to the case of FIGS. 2A to 2C.

Figure 21:
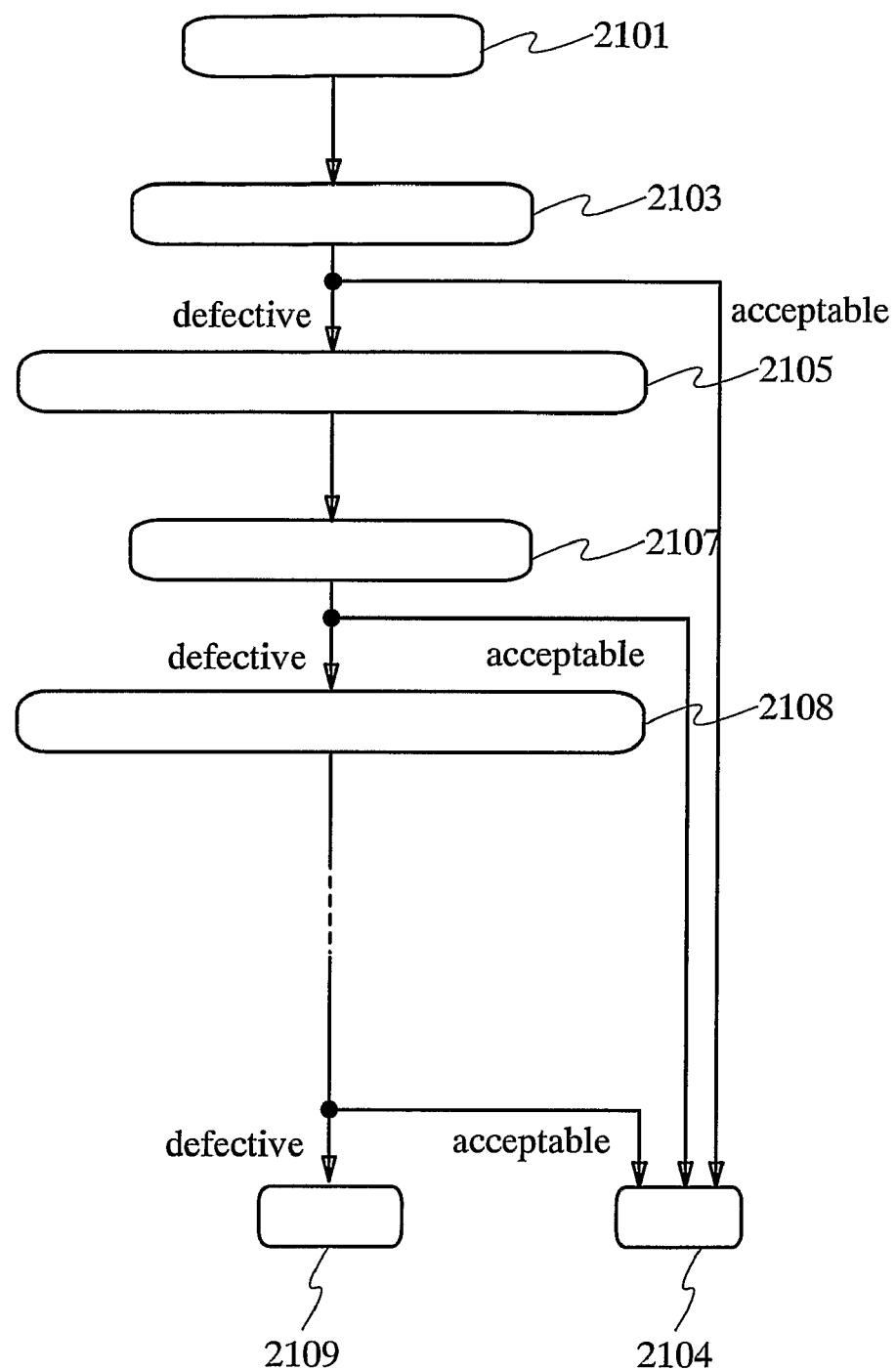
FIG. 21 is a flowchart showing operating procedures of correcting and reading a limit voltage.

The operations of correcting and reading shown in FIGS. 2A to 2C can be performed after the completion of the semiconductor device. FIG. 21 is a flowchart showing operating procedures of correcting and reading a limit voltage.

First, in FIG. 21, when a semiconductor device is completed as denoted by 2101, a limit voltage is read as denoted by 2103. If the read limit voltage is within an allowable range, the semiconductor device is determined to be acceptable and classified as a good product denoted by 2104. Meanwhile, if the read limit voltage is not within the allowable range, the semiconductor device is determined to be defective and the limit voltage is corrected by controlling the amount of charge in a floating gate as denoted by 2105.

After the correction of the limit voltage, the limit voltage is read as denoted by 2107. If the read limit voltage is within the allowable range, the semiconductor device is determined to be acceptable and classified as the good product 2104. Meanwhile, if the read limit voltage is not within the allowable range, the semiconductor device is determined to be defective.

In the semiconductor device determined to be defective, the limit voltage is corrected again by controlling the amount of charge in the floating gate as denoted by 2108. If the semiconductor device is defective even after the aforementioned operations are repeated, the semiconductor device is classified as a poor product denoted by 2109.

The yield can be improved by repeating such operations. In FIG. 21, the amount of charge in the floating gate is controlled twice as denoted by 2105 and 2108. However, it may be controlled only once or three times or more.

Described next is a semiconductor device of the invention, which uses the aforementioned limiter for an integrated circuit.

Figure 3A:
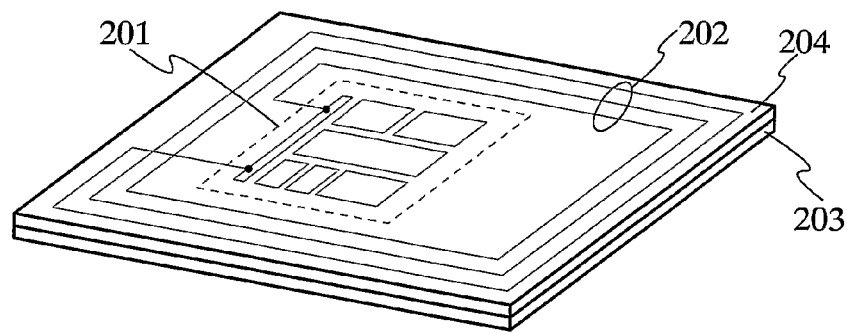
FIG. 3A is a perspective view of an ID chip of the invention and FIG. 3B is a perspective view of an IC card of the invention.

FIG. 3A is a perspective view showing one mode of an ID chip that is one of the semiconductor devices of the invention. Reference numeral 201 denotes an integrated circuit, and 202 denotes an antenna that is connected to the integrated circuit 201. Reference numeral 203 denotes a substrate and 204 denotes a cover material. The integrated circuit 201 and the antenna 202 are formed over the substrate 203, and the cover material 204 overlaps the substrate 203 so as to cover the integrated circuit 201 and the antenna 202. The cover material 204 is not necessarily used, though the mechanical strength of the ID chip can be increased by covering the integrated circuit 201 and the antenna 202 with the cover material 204.

Figure 3B:
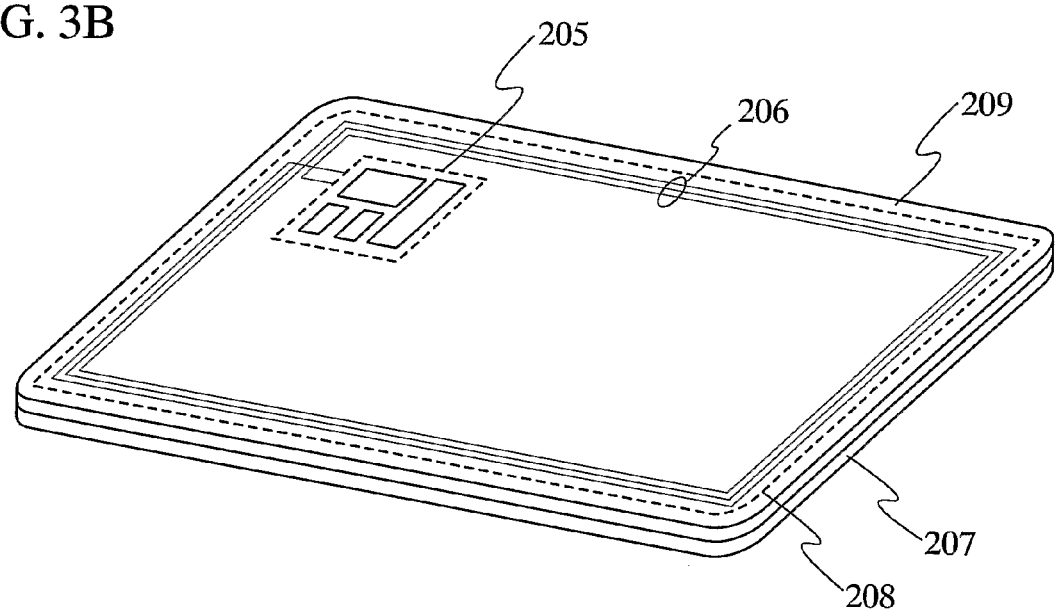

FIG. 3B is a perspective view showing one mode of an IC card that is one of the semiconductor devices of the invention. Reference numeral 205 denotes an integrated circuit, and 206 denotes an antenna that is connected to the integrated circuit 205. Reference numeral 208 denotes a substrate functioning as an inlet sheet and 207 and 209 denote cover materials. The integrated circuit 205 and the antenna 206 are formed over the substrate 208, and the substrate 208 is sandwiched between the two cover materials 207 and 209. The IC card of the invention may have a display device connected to the integrated circuit 205.

Figure 4A:
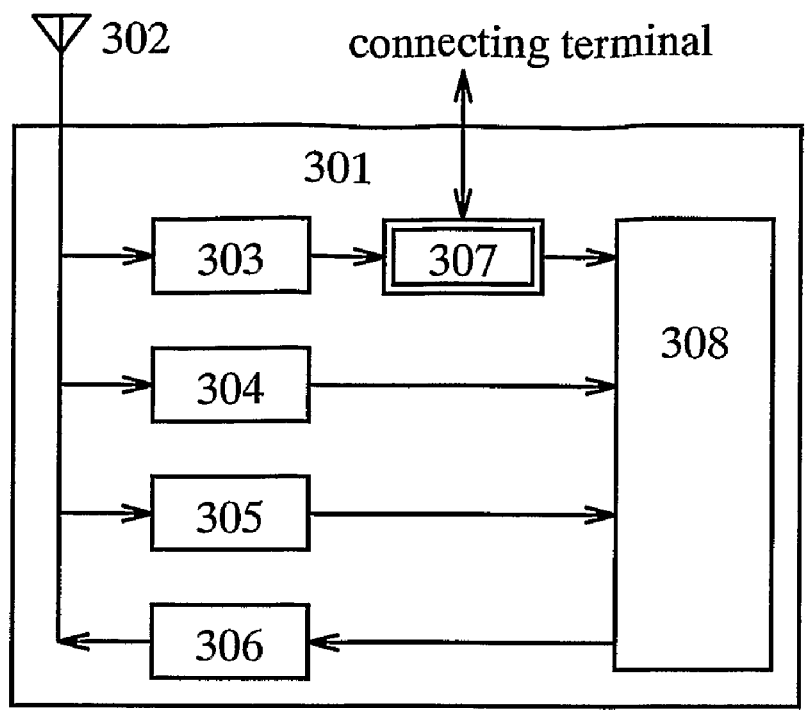
FIGS. 4A and 4B are block diagrams showing a functional configuration of a semiconductor device of the invention.

Described now is a specific configuration of the integrated circuit included in the semiconductor device of the invention. FIG. 4A is a block diagram showing one mode of functional configurations of the semiconductor device of the invention.

In FIG. 4A, reference numeral 301 denotes an integrated circuit and 302 denotes an antenna. The integrated circuit 301 includes a rectification circuit 303, a clock generation circuit 304, a modulation circuit 306, a demodulation circuit 305, a limiter 307, and a logic circuit portion 308. The logic circuit portion 308 may include various arithmetic circuits, memories and the like. As the memories, for example, an SRAM, a flash memory, a ROM, a FeRAM (Ferroelectric RAM) and the like can be employed.

A signal transmitted from a reader/writer as radio waves is converted into an AC voltage in the antenna 302 by electromagnetic induction. The AC voltage is demodulated in the demodulation circuit 305, and a generated signal is inputted to the logic circuit portion 308 in the subsequent stage. In the rectification circuit 303, a power supply voltage is generated using the AC voltage. The power supply voltage is supplied to the logic circuit portion 308 after being corrected to be no more than a limit voltage in the limiter 307 that is provided in the subsequent stage of the rectification circuit 303.

The logic circuit portion 308 operates using a signal inputted from the demodulation circuit 305 and a power supply voltage supplied from the limiter 307. When the logic circuit portion 308 operates, a signal is transmitted from the logic circuit portion 308 to the modulation circuit 306. The modulation circuit 306 can modulate the load of the antenna 302 in accordance with the signal from the logic circuit portion 308. The reader/writer can thus receive the signal from the logic circuit portion 308 by receiving the load modulation of the antenna 302 as radio waves.

Although the limiter 307 is provided in the subsequent stage of the rectification circuit 303 in FIG. 4A, the invention is not limited to this. The limiter 307 may be provided in the previous stage of the rectification circuit 303 as well. Alternatively, the limiter 307 may be provided in the previous or subsequent stage of the clock generation circuit 304, in the previous or subsequent stage of the modulation circuit 306, in the previous or subsequent stage of the demodulation circuit 305, within the logic circuit portion 308, or the like.

Figure 4B:
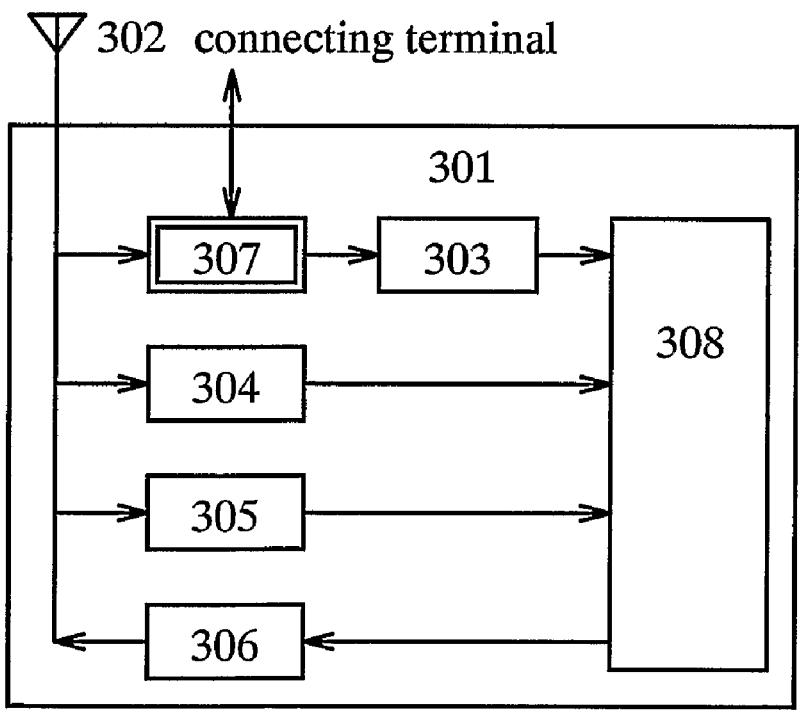

FIG. 4B is a block diagram showing one mode of functional configurations of the semiconductor device of the invention in the case where the limiter 307 is provided in the previous stage of the rectification circuit 303. The components in FIG. 4B are the same as those shown in FIG. 4A and denoted by the same reference numerals. In the case of FIG. 4B, an AC voltage from the antenna 302 is corrected to be no more than a limit voltage in the limiter 307. Then, a power supply voltage is generated in the rectification circuit 303 by using the AC voltage corrected to be no more than a limit voltage.

The semiconductor device of the invention can transmit a signal by an electromagnetic coupling method, an electromagnetic induction method, a microwave method, or other transmitting methods. Particularly in the case of the electromagnetic coupling method or the electromagnetic induction method, the semiconductor device is exposed to large amplitude radio waves, thereby an excessive AC voltage may occur in the antenna. Also in the microwave method or the other transmitting methods, noise may be generated in a signal in the semiconductor device. The limiter of the invention is so effective that dielectric breakdown due to the excessive AC voltage or noise in the signal can be prevented from occurring in an integrated circuit.

In this embodiment mode, the antenna has a circular or spiral conductive wire, though the invention is not limited to this. Alternatively, a conductive film may be used as an antenna as well.

EMBODIMENT 1

Described in this embodiment is a limiter of the invention using a plurality of diode-connected transistors.

Figure 5A:
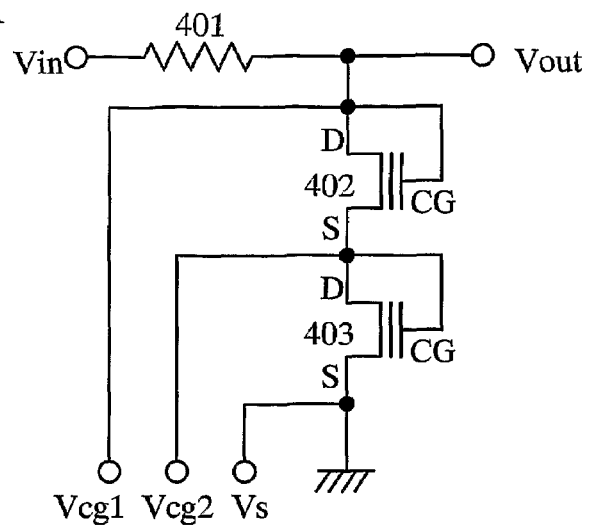
FIGS. 5A to 5C are circuit diagrams of a limiter of the invention.

FIG. 5A is a circuit diagram of a limiter of this embodiment. In FIG. 5A, reference numeral 401 denotes a resistor, and 402 and 403 denote diode-connected transistors. The transistors 402 and 403 each has a floating gate (FG) and a control gate (CG). Although the transistor 402 and the transistor 403 are both N-channel transistors in FIG. 5A, one or both of them may be P-channel transistors. In either case, all the diode-connected transistors are connected in series so as to have the same forward current direction.

A voltage Vin from an input terminal is supplied to a first terminal of two terminals of the resistor 401. The transistor 402 and the transistor 403 are connected in series so as to have the same forward current direction. Specifically in FIG. 5A, the control gate and a drain (D) of the transistor 402 are connected to a second terminal of the resistor 401, the control gate and a drain of the transistor 403 are connected to a source (S) of the transistor 402, and a source of the transistor 403 is supplied with a constant voltage such as a ground (GND). A voltage at the second terminal of the resistor 401 corresponds to a voltage Vout at an output terminal of the limiter.

In the case where a plurality of diode-connected transistors are connected in series as shown in FIG. 5A, a limit voltage is equal to the sum of a forward drop voltage Vf of each transistor.

The limiter shown in FIG. 5A does not necessarily include the resistor 401. In this case, the voltage Vin from the input terminal is supplied directly to the control gate and the drain of the transistor 402, and a control gate-drain voltage dropped by the transistor 402 is supplied to a circuit in the subsequent stage as the voltage Vout at the output terminal of the limiter.

Figure 5B:
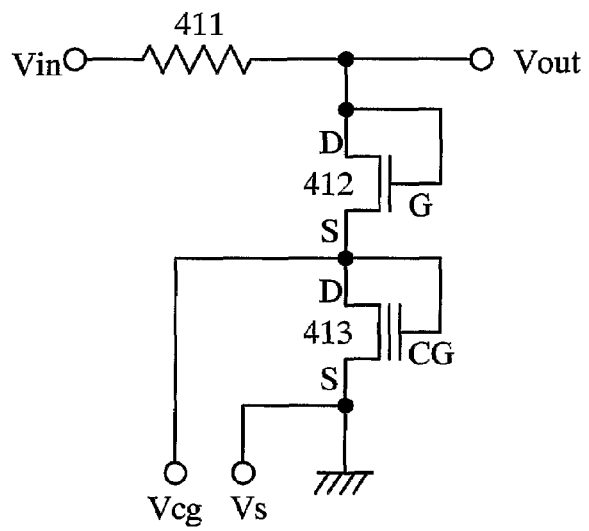

FIG. 5B is a circuit diagram of the limiter of this embodiment, which is different from that shown in FIG. 5A. In FIG. 5B, reference numeral 411 denotes a resistor, and 412 and 413 denote diode-connected transistors. The transistor 412 does not have a floating gate and has only a gate (G). The transistor 413 has two gates of a floating gate (FG) and a control gate (CG). Although the transistor 412 and the transistor 413 are both N-channel transistors in FIG. 5B, one or both of them may be P-channel transistors. In either case, all the diode-connected transistors are connected in series so as to have the same forward current direction.

A voltage Vin from an input terminal is supplied to a first terminal of two terminals of the resistor 411. The transistor 412 and the transistor 413 are connected in series so as to have the same forward current direction. Specifically in FIG. 5B, the gate and a drain (D) of the transistor 412 are connected to a second terminal of the resistor 411, the control gate and a drain of the transistor 413 are connected to a source (S) of the transistor 412, and a source of the transistor 413 is supplied with a constant voltage such as a ground (GND). A voltage at the second terminal of the resistor 411 corresponds to a voltage Vout at an output terminal of the limiter.

Since the limiter shown in FIG. 5B includes, similarly to the limiter shown in FIG. 5A, a plurality of diode-connected transistors that are connected in series, a limit voltage is equal to the sum of a forward drop voltage Vf of each transistor.

The limiter shown in FIG. 5B does not necessarily include the resistor 411. In such a case, the voltage Vin from the input terminal is supplied directly to the gate and the drain of the transistor 412, and a gate-drain voltage dropped by the transistor 412 is supplied to a circuit in the subsequent stage as the voltage Vout at the output terminal of the limiter.

Figure 5C:
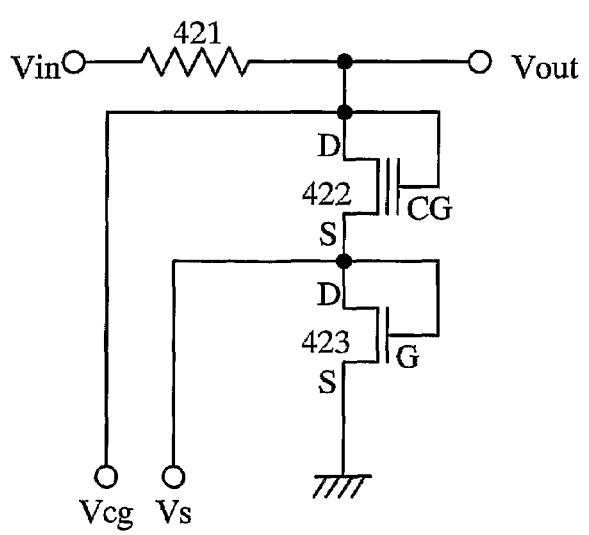

FIG. 5C is a circuit diagram of the limiter of this embodiment, which is different from that shown in FIGS. 5A and 5B. In FIG. 5C, reference numeral 421 denotes a resistor, and 422 and 423 denote diode-connected transistors. The transistor 422 has two gates of a floating gate (FG) and a control gate (CG). The transistor 423 does not have a floating gate and has only a gate (G). Although the transistor 422 and the transistor 423 are both N-channel transistors in FIG. 5C, one or both of them may be P-channel transistors. In either case, all the diode-connected transistors are connected in series so as to have the same forward current direction.

A voltage Vin from an input terminal is supplied to a first terminal of two terminals of the resistor 421. The transistor 422 and the transistor 423 are connected in series so as to have the same forward current direction. Specifically in FIG. 5C, the control gate and a drain (D) of the transistor 422 are connected to a second terminal of the resistor 421, the gate and a drain (D) of the transistor 423 are connected to a source (S) of the transistor 422, and a source of the transistor 423 is supplied with a constant voltage such as a ground (GND). A voltage at the second terminal of the resistor 421 corresponds to a voltage Vout at an output terminal of the limiter.

Since the limiter shown in FIG. 5C includes, similarly to the limiters shown in FIGS. 5A and 5B, a plurality of diode-connected transistors that are connected in series, a limit voltage is equal to the sum of a forward drop voltage Vf of each transistor.

The limiter shown in FIG. 5C does not necessarily include the resistor 421. In such a case, the voltage Vin from the input terminal is supplied directly to the control gate and the drain of the transistor 422, and a control gate-drain voltage dropped by the transistor 422 is supplied to a circuit in the subsequent stage as the voltage Vout at the output terminal of the limiter.

Described in this embodiment is the limiter that limits the maximum value of the voltage Vin from the input terminal, though the invention may also be applied to a limiter that limits the minimum value of the voltage Vin.

The number of diode-connected transistors is not limited to two in the invention, and three or more diode-connected transistors may be connected in series as well.

The configuration shown in this embodiment, where a plurality of diode-connected transistors or diodes (hereinafter both called diodes in this embodiment) are connected in series, is desirable in the following ways.

In a chip, a limiter is generally connected in parallel to a logic circuit through a power supply line and a ground line. However, in the limiter, it is necessary to supply a high voltage to a diode when controlling the amount of charge accumulated in a floating gate, and the high voltage has an excessive value for the logic circuit.

In the case of the limiter of this embodiment, even when a high voltage is applied to one diode, the high voltage is not substantially applied to a logic circuit when the high voltage is a reverse voltage for the other diodes. Also, even when the high voltage is a forward voltage for the other diodes, the voltage directly applied to the logic circuit is reduced by threshold voltages of the other diodes.

According to such a limiter including a plurality of diodes connected in series, a limit voltage can be corrected while suppressing a high voltage applied to the logic circuit as compared with a limiter including one diode.

EMBODIMENT 2

According to the invention, even when other semiconductor element is provided between a control gate and a drain of a transistor, the transistor can be considered to be diode connected as long as it functions as a diode. Described in this embodiment is an example where other semiconductor element is provided between a control gate and a drain of a transistor used in a limiter.

Figure 6A:
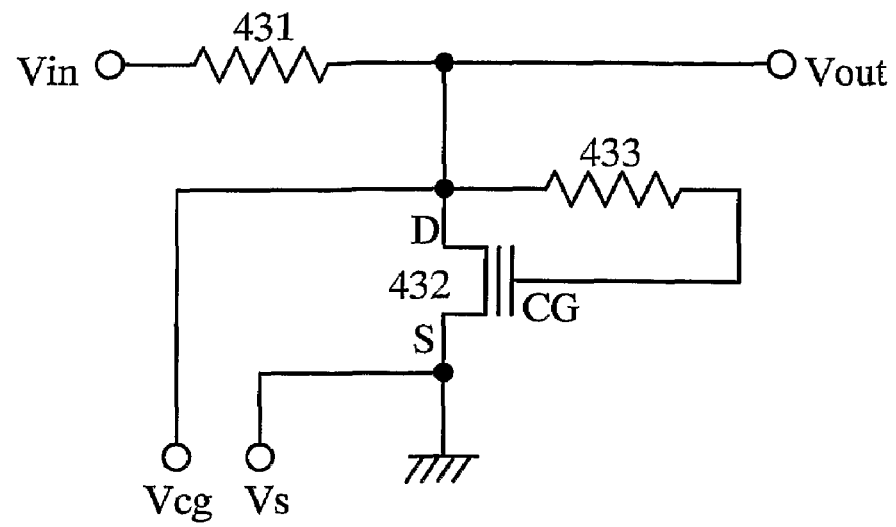
FIGS. 6A and 6B are circuit diagrams of a limiter of the invention.

FIG. 6A is a circuit diagram showing an example of the limiter of this embodiment. In FIG. 6A, reference numerals 431 and 433 denote resistors, and 432 denotes a transistor. The transistor 432 has two gates of a floating gate (FG) and a control gate (CG). In FIG. 6A, the transistor 432 is an N-channel transistor.

A voltage Vin from an input terminal is supplied to a first terminal of two terminals of the resistor 431. The resistor 433 is connected between the control gate and a drain (D) of the transistor 432. The drain of the transistor 432 is connected to a second terminal of the resistor 431. A source of the transistor 432 is supplied with a constant voltage such as a ground (GND). A voltage at the second terminal of the resistor 431 corresponds to a voltage Vout at an output voltage of the limiter.

Although the transistor 432 is an N-channel transistor in FIG. 6A, it may be a P-channel transistor. Even in the case of using a P-channel transistor as the transistor 432, the forward current direction is set to be the same as in the case of using an N-channel transistor.

The limiter shown in FIG. 6A does not necessarily include the resistor 431. In this case, the voltage Vin from the input terminal is supplied directly to the drain of the transistor 432, and a drain voltage dropped by the transistor 432 is supplied to a circuit in the subsequent stage as the voltage Vout at the output terminal of the limiter.

Figure 6B:
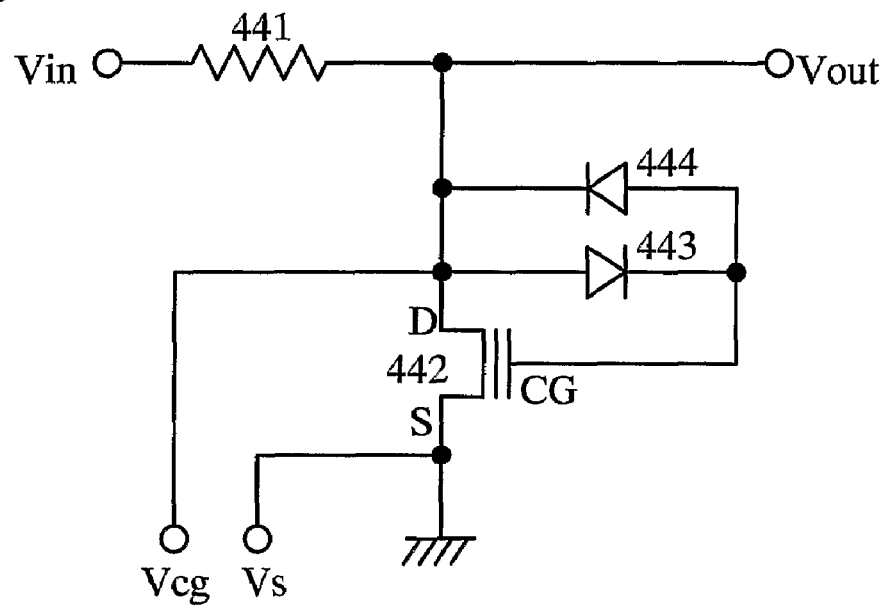

FIG. 6B is a circuit diagram showing another example of the limiter of this embodiment. In FIG. 6B, reference numeral 441 denotes a resistor, 442 denotes a transistor, and 443 and 444 denote diodes. The transistor 442 has two gates of a floating gate (FG) and a control gate (CG). In FIG. 6B, the transistor 442 is an N-channel transistor.

A voltage Vin from an input terminal is supplied to a first terminal of two terminals of the resistor 441. The diode 443 and the diode 444 are connected in parallel between the control gate and a drain (D) of the transistor 442. The diode 443 and the diode 444 are connected so as to have forward current directions reverse to each other. The drain of the transistor 442 is connected to a second terminal of the resistor 441. A source of the transistor 442 is supplied with a Constant voltage such as a ground (GND). A voltage at the second terminal of the resistor 441 corresponds to a voltage Vout at an output terminal of the limiter.

Although the transistor 442 is an N-channel transistor in FIG. 6B, it may be a P-channel transistor. Even in the case of using a P-channel transistor as the transistor 442, the forward current direction is set to be the same as in the case of using an N-channel transistor.

The limiter shown in FIG. 6B does not necessarily include the resistor 441. In this case, the voltage Vin from the input terminal is supplied directly to the drain of the transistor 442, and a drain voltage dropped by the transistor 442 is supplied to a circuit in the subsequent stage as the voltage Vout at the output terminal of the limiter.

Described in this embodiment is the limiter that limits the maximum value of the voltage Vin from the input terminal, though the invention may also be applied to a limiter that limits the minimum value of the voltage Vin.

This embodiment can be freely combined with Embodiment mode or Embodiment 1.

EMBODIMENT 3

Described in this embodiment is a limiter of the invention using an operational amplifier.

Figure 7:
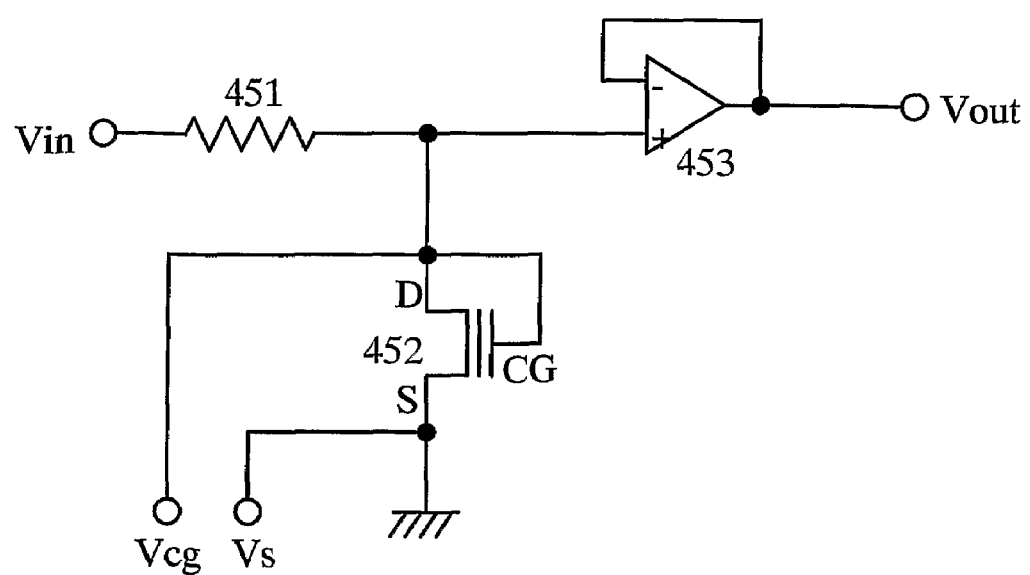
FIG. 7 is a circuit diagram of a limiter of the invention.

FIG. 7 is a circuit diagram showing an example of the limiter of this embodiment. In FIG. 7, reference numeral 451 denotes a resistor, 452 denotes a diode-connected transistor, and 453 denotes an operational amplifier. The transistor 452 has two gates of a floating gate (FG) and a control gate (CG). In FIG. 7, the transistor 452 is an N-channel transistor.

A voltage Vin from an input terminal is supplied to a first terminal of two terminals of the resistor 451. The control gate and a drain (D) of the transistor 452 are connected to a second terminal of the resistor 451. A source (S) of the transistor 452 is supplied with a constant voltage such as a ground (GND).

The second terminal of the resistor 451 is connected to a non-inverting input terminal of the operational amplifier 453. An inverting input terminal of the operational amplifier 453 is connected to an output terminal thereof, and a voltage at the output terminal corresponds to a voltage Vout at an output terminal of the limiter.

Output impedance can be reduced by providing an analog buffer such as an operational amplifier at the output side of the limiter as shown in this embodiment. Although the operational amplifier is used as an analog buffer in this embodiment, other analog buffers can be used as well.

Although the transistor 452 is an N-channel transistor in FIG. 7, it may be a P-channel transistor. Even in the case of using a P-channel transistor as the transistor 452, the forward current direction is set to be the same as in the case of using an N-channel transistor.

The limiter shown in FIG. 7 does not necessarily include the resistor 451. In such a case, the voltage Vin from the input terminal is supplied directly to the control gate and the drain of the transistor 452, and a control gate-drain voltage dropped by the transistor 452 is supplied to the non-inverting input terminal of the operational amplifier 453.

Described in this embodiment is the limiter that limits the maximum value of the voltage Vin from the input terminal, though the invention may also be applied to a limiter that limits the minimum value of the voltage Vin.

This embodiment can be freely combined with Embodiment mode or Embodiment 1.

EMBODIMENT 4

Described in this embodiment is a semiconductor device that includes a limiter as well as a control circuit for controlling the amount of charge in a floating gate.

Figure 8:
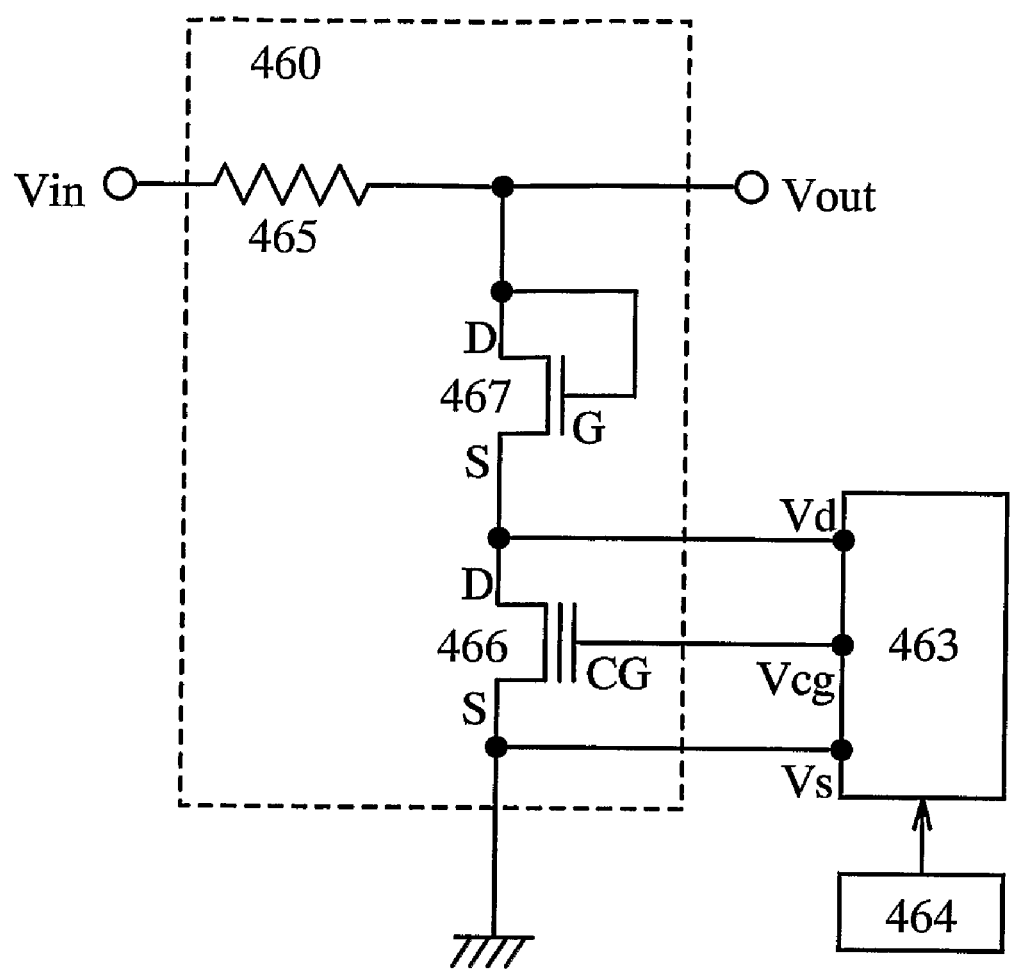
FIG. 8 is a block diagram of a limiter, a pulse generation circuit, and a booster circuit that are included in a semiconductor device of the invention.

FIG. 8 is a block diagram of a limiter 460, a pulse generation circuit 463 corresponding to a control circuit, and a booster circuit 464. The limiter 460 in FIG. 8 has the same configuration as that shown in FIG. 5B in Embodiment 1, though this embodiment is not limited to this. The limiter 460 of this embodiment may have any one of the configurations shown in Embodiment mode and Embodiments 1 to 3.

In FIG. 8, the limiter 460 includes a resistor 465, and diode-connected transistors 466 and 467. The transistor 467 does not have a floating gate and has only a gate (G). The transistor 466 has two gates of a floating gate (FG) and a control gate (CG). Although the transistor 467 and the transistor 466 are both N-channel transistors in FIG. 8, one or both of them may be P-channel transistors.

A voltage Vin from an input terminal is supplied to a first terminal of two terminals of the resistor 465. The transistor 467 and the transistor 466 are connected in series so as to have the same forward current direction. Specifically in FIG. 8, the gate and a drain (D) of the transistor 467 are connected to a second terminal of the resistor 465, a drain of the transistor 466 is connected to a source (S) of the transistor 467, and a source of the transistor 466 is supplied with a constant voltage such as a ground (GND). A voltage at the second terminal of the resistor 465 corresponds to a voltage Vout at an output terminal of the limiter.

Since the limiter shown in FIG. 8 includes a plurality of diode-connected transistors that are connected in series, a limit voltage corresponds to the sum of a forward drop voltage Vf of each transistor.

In the limiter of this embodiment, the control gate of the transistor 466 is not connected to the drain of the transistor 466 but connected to the pulse generation circuit 463. The drain and the source of the transistor 466 are also connected to the pulse generation circuit 463.

The booster circuit 464 generates a voltage Vcg, a voltage Vd, and a voltage Vs that are used for correcting a threshold voltage of the transistor 466, and supplies them to the pulse generation circuit 463. The pulse generation circuit 463 selects an appropriate voltage depending on an operation to generate a signal with a controlled pulse width, and applies the signal voltage to each of the control gate, the source, and the drain of the transistor 466.

According to this embodiment, the voltages at the control gate, the drain, and the source of the transistor 466 are not controlled from outside the semiconductor device through connecting terminals, but controlled within the semiconductor device using the pulse generation circuit 463.

An operation of the limiter 460 shown in FIG. 8 is described specifically. In a normal operation of the ID chip, the limiter 460 operates so as to achieve its function. That is, the drain and the control gate of the transistor 466 are connected by using the pulse generation circuit 463, and the source of the transistor 466 is brought into a high impedance state.

A limit voltage can be read by changing the output amplitude or frequency of a reader/writer and checking the response of the ID chip.

More specifically, if the limit voltage is low, a sufficient power supply voltage cannot be obtained in the ID chip, resulting in frequency characteristics of the ID chip that do not meet specifications. Accordingly, the limit voltage is determined to be low in the case where the frequency characteristics of the ID chip do not meet specifications even when, for example, the output of the reader/writer and communication distance are set within specifications. In such a case, the threshold voltage of the transistor 466 may be corrected so as to increase the limit voltage.

Meanwhile, if the limit voltage is high, an excessive power supply voltage occurs in the ID chip and the integrated circuit may be broken in some cases. Accordingly, the limit voltage is determined to be high in the case where the frequency characteristics of the ID chip completely meet specifications when, for example, the output amplitude and communication distance of a reader/writer are set within specifications. In such a case, the threshold voltage of the transistor 466 may be corrected so as to reduce the limit voltage while maintaining an operating margin.

The threshold voltage of the transistor 466 is corrected in accordance with correction instructions from the reader/writer.

The threshold voltage can be increased by hot electron injection or tunnel current by applying to the transistor 466 a short pulse (e.g., 1 to 10 μs) with Vd=Vcg=12 V and Vs=0 V. Meanwhile, the threshold voltage can be reduced by tunnel current by applying to the transistor 466 a short pulse (e.g., 100 μs to 1 ms) with Vcg=−15 V, and Vd=Vs=0 V.

Correction of the threshold voltage has to be performed in an environment where a power supply voltage within the ID chip is held to no more than a limit voltage so as not to flow a forward current to the limiter 460.

As set forth above, a limit voltage can be set using a reader/writer by providing the control circuit within the ID chip. Therefore, a user can change the limit voltage, for example, after the shipment.

When the control circuit as well as the limiter is provided in a semiconductor device as described in this embodiment, the number of connecting terminals provided in the semiconductor device can be reduced.

The limiter shown in FIG. 8 does not necessarily include the resistor 465. In this case, the voltage Vin from the input terminal is supplied directly to the gate and the drain of the transistor 467, and a gate-drain voltage dropped by the transistor 467 is supplied to a circuit in the subsequent stage as the voltage Vout at the output terminal of the limiter.

Although the limiter that limits the maximum value of the voltage Vin from the input terminal is described in this embodiment, the invention may also be applied to a limiter that limits the minimum value of the voltage Vin.

EMBODIMENT 5

A manufacturing method of an ID chip that is one of the semiconductor devices of the invention is hereinafter described in detail. Note that a TFT is shown as an example of a semiconductor element in this embodiment, a semiconductor element used for an integrated circuit is not limited to this. For example, a memory element, a diode, and a photoelectric converter, or as for other element a resistor element, a coil, a capacitor element, an inductor and the like can be used as well as the TFT.

Figure 9A:
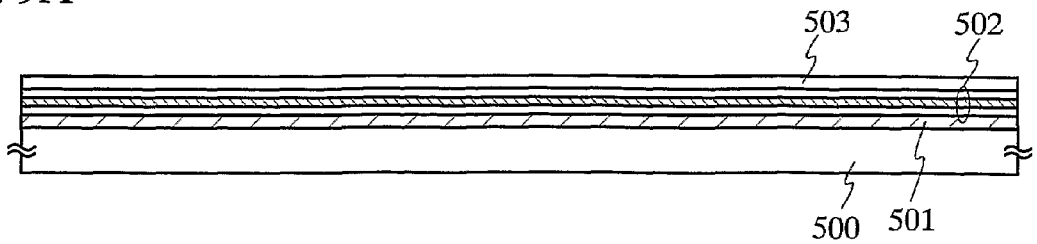
FIGS. 9A to 9E are diagrams showing a manufacturing method of a semiconductor device of the invention.

First, as shown in FIG. 9A, a peeling layer 501 is formed over a first substrate 500 with heat resistance. As the first substrate 500, for example, a glass substrate such as barium borosilicate glass and alumino borosilicate glass, a quartz substrate, a ceramic substrate or the like can be employed. Alternatively, a metal substrate including a stainless substrate or a semiconductor substrate may also be used. A flexible substrate formed from synthetic resin such as plastic, which tends to have lower heat resistance than the aforementioned substrates, can be used as long as it can withstand a processing temperature during manufacturing steps.

The peeling layer 501 can be formed by sputtering, low pressure CVD, plasma CVD or the like using a layer mainly containing silicon such as amorphous silicon, polycrystalline silicon, single crystalline silicon, and microcrystalline silicon (including semi-amorphous silicon). In this embodiment, an amorphous silicon film with a thickness of about 50 nm is formed by plasma CVD to be used as the peeling layer 501. The peeling layer 501 is preferably formed by plasma CVD rather than by sputtering, since it is possible to prevent dust from entering the peeling layer 501 and suppress the amount of Ar contained in the peeling layer 501. Accordingly, even when heat treatment including laser crystallization and the like is applied to the peeling layer 501 in the subsequent manufacturing steps, the peeling layer 501 can be prevented from being peeled off from a base film 502 formed later due to dust or Ar. The material of the peeling layer 501 is not limited to silicon, and it may be formed from a material that can be selectively removed by etching. The thickness of the peeling layer 501 is desirably 10 to 100 nm.

Next, the base film 502 is formed over the peeling layer 501. The base film 502 is provided in order to prevent an alkaline metal such as Na or an alkaline earth metal contained in the first substrate 500 from diffusing into semiconductor films and adversely affecting characteristics of semiconductor elements such as TFTs. The base film 502 also has a function of protecting the semiconductor elements in the subsequent step of peeling off the semiconductor elements. The base film 502 can be formed of an insulating film, for example, such as a silicon oxide film, a silicon oxynitride film, a silicon nitride film, and a silicon nitride oxide film.

The base film 502 may be formed of a single insulating film or a plurality of stacked insulating films. In this embodiment, the base film 502 is formed by sequentially stacking a silicon oxynitride film with a thickness of 100 nm, a silicon nitride oxide film with a thickness of 50 nm, and a silicon oxynitride film with a thickness of 100 nm, though the film material, film thickness, and number of stacked layers are not limited to these. For example, instead of the silicon oxynitride film of the bottom layer, a resin film including siloxane with a thickness of 0.5 to 3 μm may be formed by spin coating, slit coating, droplet discharging, printing or the like. Further, instead of the silicon nitride oxide film of the middle layer, a silicon nitride film (such as $SiN_x$ and $Si_3N_4$) may be used. Moreover, instead of the silicon oxynitride film of the upper layer, a silicon oxide film may be used. The thickness of each layer is desirably 0.05 to 3 μm and can be freely selected from this range.

Alternatively, the bottom layer of the base film 502 that is the closest to the peeling layer 501 may be formed of a silicon oxynitride film or a silicon oxide film, the middle layer may be formed of a resin film including siloxane, and the upper layer may be formed of a silicon oxide film.

Note that resin including siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

The silicon oxide film can be formed by thermal CVD, plasma CVD, atmospheric pressure CVD, bias ECRCVD or the like using a mixed gas of $SiH_4$ and $O_2$, TEOS (tetraethoxysilane) and $O_2$, or the like. The silicon nitride film can typically be formed by plasma CVD using a mixed gas of $SiH_4$ and $NH_3$. The silicon oxynitride film and the silicon nitride oxide film can typically be formed by plasma CVD using a mixed gas of $SiH_4$ and $N_2O$.

Subsequently, a semiconductor film 503 is formed over the base film 502. The semiconductor film 503 is desirably formed without being exposed to the atmosphere after the formation of the base film 502. The thickness of the semiconductor film 503 is 20 to 200 nm (preferably 40 to 170 nm, and more preferably 50 to 150 nm). The semiconductor film 503 may be formed from an amorphous semiconductor, a semi-amorphous semiconductor, or a polycrystalline semiconductor. As the semiconductor, silicon germanium as well as silicon may be employed. If silicon germanium is used, the concentration of germanium is desirably about 0.01 to 4.5 atomic %.

The semiconductor film 503 may be crystallized by a known method such as laser crystallization using laser light and crystallization using a catalytic element. The crystallization using a catalytic element and the laser crystallization may also be combined. If the first substrate 500 is formed of a high heat resistant substrate such as a quartz substrate, crystallization may be performed by combining thermal crystallization using an electric furnace, lamp anneal crystallization using infrared light, crystallization using a catalytic element, and anneal at a high temperature of about 950° C.

In the case of laser crystallization, heat treatment is applied to the semiconductor film 503 at a temperature of 550° C. for four hours before the laser crystallization, such that the resistance of the semiconductor film 503 to laser is improved. It is possible to obtain a crystal with a large grain size when second to fourth harmonics of a fundamental wave are used with a continuous wave solid-state laser. Typically, it is desirable to use the second harmonic (532 nm) or the third harmonic (355 nm) of a Nd:$YVO_4$ laser (fundamental wave: 1064 nm). More specifically, laser light emitted from a continuous wave $YVO_4$ laser is converted to the harmonic with a non-linear optical element to obtain laser light having an output of 10 W. More preferably, the laser light is formed so as to be a rectangular shape or an elliptical shape by an optical system, and irradiated on the surface of the semiconductor film 503. At this time, an energy density of about 0.01 to 100 $MJ/cm^2$ (preferably 0.1 to 10 $MJ/cm^2$) is required. The laser light is irradiated at a scan rate of about 10 to 2000 cm/sec.

Alternatively, the laser crystallization may be performed by using pulsed laser light with an oscillation frequency of 10 MHz or more which is a much higher frequency than that of tens to hundreds of Hz of a normally used pulsed laser. It is said that it takes tens to hundreds of nsec to completely solidify a semiconductor film after irradiating pulsed laser light thereto. Accordingly, by using the aforementioned frequency range, pulsed laser light can be irradiated before a semiconductor film dissolved by the preceding laser light becomes solidified. Thus, solid-liquid interface can be sequentially moved in a semiconductor film, thereby a semiconductor film having crystal grains that are sequentially grown in the scan direction can be formed. More specifically, a group of crystal grains each having a grain width of 10 to 30 µm in the scan direction and 1 to 5 µm in the direction perpendicular to the scan direction can be obtained. Accordingly, single crystal grains extending along the scan direction are formed, and a semiconductor film with few crystal grain boundaries at least in the channel length of a TFT can be achieved.

In the laser crystallization, continuous wave fundamental laser light and continuous wave harmonic laser light may be irradiated, or continuous wave fundamental laser light and harmonic pulsed laser light may be irradiated.

The laser irradiation may be performed in an inert gas atmosphere such as a rare gas and an inert gas such as nitrogen. According to this, unevenness of the surface of a semiconductor due to laser irradiation can be suppressed, which prevents variations in thresholds of the gate voltage caused by variations in interface state density.

According to the aforementioned laser irradiation, the crystallinity of the semiconductor film 503 can be much improved. Note that as the semiconductor film 503, a polycrystalline semiconductor may be formed in advance by sputtering, plasma CVD, thermal CVD or the like.

Although the semiconductor film 503 is crystallized in this embodiment, the subsequent step may be performed by using an amorphous silicon film or a microcrystalline semiconductor film which is not crystallized. A TFT using an amorphous semiconductor or a microcrystalline semiconductor has the advantage that it can be formed by fewer manufacturing steps than a TFT using a polycrystalline semiconductor, resulting in improved cost and yield.

The amorphous semiconductor can be obtained by glow discharge decomposition of silicon gas. Typically, $SiH_4$ or $Si_2H_6$ is used as silicon gas. The silicon gas may be diluted with hydrogen, or mixed gas of hydrogen and helium.

The semi-amorphous semiconductor is a semiconductor having an intermediate structure between amorphous and crystalline (including single crystalline and polycrystalline) structures. This semiconductor has a third state that is stable in free energy, and it is a kind of a crystalline semiconductor that has a short range order and a lattice distortion. The semi-amorphous semiconductor with crystal grains of 0.5 to 20 nm can be dispersed in a non-single crystalline semiconductor and Raman spectrum is shifted to the lower frequency band than $520 cm^{-1}$. The semi-amorphous semiconductor has an x-ray diffraction pattern with peaks at (111) and (220) that are considered to be due to Si crystal lattice. Further, the semiconductor is mixed with at least 1 atomic % of hydrogen or halogen for terminating dangling bonds. Such a semiconductor is called herein a semi-amorphous semiconductor (SAS) for convenience. When a noble gas element such as helium, argon, krypton, and neon is mixed into an SAS, the lattice distortion is increased and the stability is thus enhanced, leading to a high quality SAS.

The SAS can be obtained by glow discharge decomposition of silicon gas. Typically, $SiH_4$ is used as silicon gas, though $Si_2H_6$, $SiH_2Cl_2$, $SiHCl_3$, $SiCl_4$, $SiF_4$ or the like may be used as well. The formation of the SAS can be facilitated by diluting the silicon gas with hydrogen or gas added with a single or a plurality of rare gas elements selected from hydrogen and helium, argon, krypton, and neon. The silicon gas is preferably diluted at a dilution rate of 2 to 1000. The silicon gas may also be mixed with carbon gas such as $CH_4$ and $C_2H_6$, germanium gas such as $GeH_4$ and $GeF_4$, $F_2$, or the like to set the energy bandwidth to 1.5 to 2.4 eV, or 0.9 to 1.1 eV.

In the case of using, for example, $SiH_4$ added with $H_2$ or $SiH_4$ added with $F_2$, the subthreshold value (S value) of a TFT formed by using such a semi-amorphous semiconductor can be set to 0.35 V/sec or less (preferably 0.09 to 0.25 V/dec), and the mobility to 10 $cm^2$/Vdec. For example, a 19-stage ring oscillator constituted by such a TFT using the semi-amorphous semiconductor has an oscillation frequency of 1 MHz or more, and preferably 100 MHz or more at a power supply voltage of 3 to 5 V. The delay time for each stage of an inverter is 26 ns, and preferably 0.26 ns or less at a power supply voltage of 3 to 5 V.

Figure 9B:
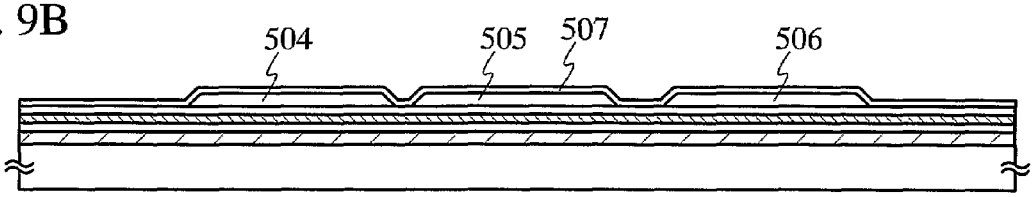

Next, as shown in FIG. 9B, the crystallized semiconductor film 503 is patterned to form island shape semiconductor films 504 to 506. Then, a first gate insulating film 507 is formed so as to cover the island shape semiconductor films 504 to 506. The first gate insulating film 507 can be formed by plasma CVD, sputtering or the like using a single or a plurality of layers of a silicon nitride film, a silicon oxide film, a silicon nitride oxide film, or a silicon oxynitride film. If a plurality of layers are stacked, a three-layer structure of a silicon oxide film, a silicon nitride film, and a silicon oxide film that are stacked in this order from the substrate side is preferably adopted.

The thinner the first gate insulating film 507 is, the faster the charge of a floating gate of a TFT 542 used as a diode can be controlled by hot electron injection or tunnel current. Therefore, if emphasis is placed on higher speed control of charge rather than increased withstand voltage, the first gate insulating film 507 is desirably as thin as possible. In this embodiment, the thickness of the first gate insulating film 507 is 1 to 100 nm, and preferably 1 to 10 nm.

Figure 9C:
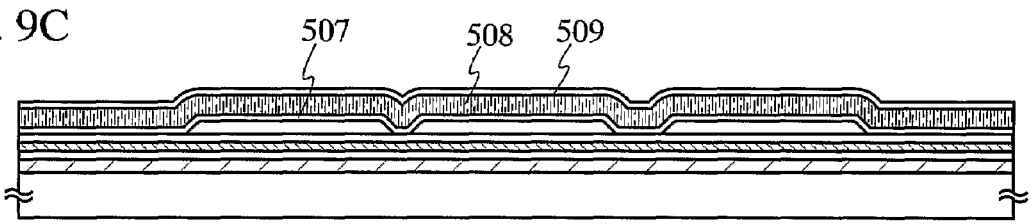

Subsequently, as shown in FIG. 9C, a first conductive film 508 is formed over the first gate insulating film 507. In this embodiment, a tantalum nitride (TaN) film or a tantalum (Ta) film is used as the first conductive film 508. It is needless to say that the material of the first conductive film 508 is not limited to this and can be selected arbitrarily. However, it is desirable to use a material having sufficiently high etch selectivity relative to the first gate insulating film 507 in the subsequent etching process. For example, when the first conductive film 508 is formed from TaN or Ta and the first gate insulating film 507 is formed from a silicon oxide film, the etch selectivity of the first conductive film 508 relative to the first gate insulating film 507 can be 10 or more by using $Cl_2$ as etching gas. The sufficiently high etch selectivity prevents the exposed first gate insulating film 507 from being overetched.

In addition, the thinner the first conductive film 508 is, the shorter the time of etching the first conductive film 508 is. Accordingly, the first conductive film 508 can be etched while suppressing overetching of the first gate insulating film 507. Thus, it is preferable that the thickness of the first conductive film 508 be 5 to 100 nm, and more preferably 5 to 20 nm.

Then, a second gate insulating film 509 is formed over the first conductive film 508. The second gate insulating film 509 can be formed using the same material as that of the first gate insulating film 507. In this embodiment, a silicon oxide film is employed.

Figure 9D:
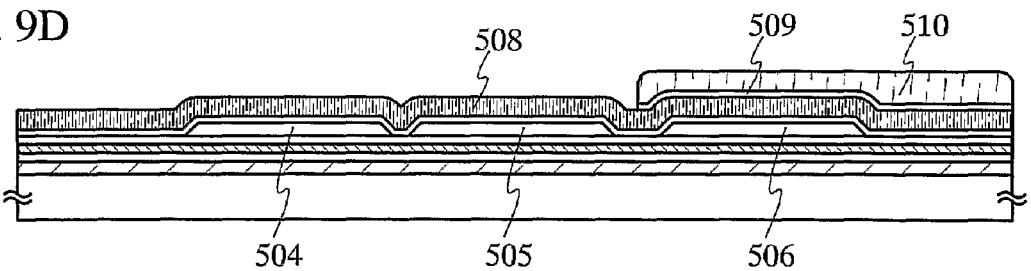

As shown in FIG. 9D, a mask 510 is formed so as to cover the island shape semiconductor film 506. Then, the second gate insulating film 509 of the portion overlapping the island shape semiconductor films 504 and 505 is removed by etching, thereby the first conductive film 508 is exposed partially. The second gate insulating film 509 can be etched by plasma etching using $CHF_3$ gas. According to this etching, the etch selectivity of tantalum nitride or tantalum of the first conductive film 508 relative to silicon oxide of the second gate insulating film 509 can be 10 or more. Also in the case of wet etching using hydrofluoric acid, sufficiently high etch selectivity of tantalum nitride or tantalum can be secured.

Figure 9E:
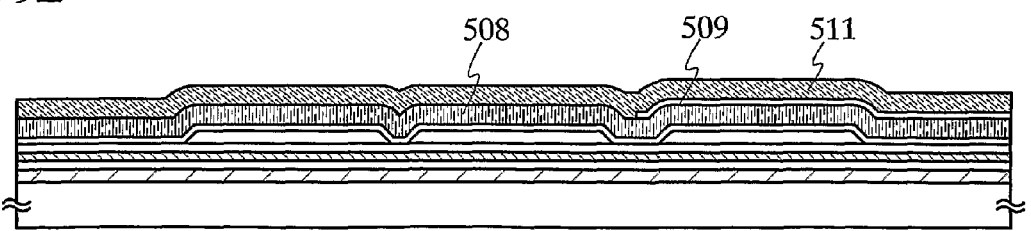

As shown in FIG. 9E, a second conductive film 511 is formed so as to cover the partially etched second gate insulating film 509 and the first conductive film 508. The second conductive film 511 may be formed of a conductive film similarly to the first conductive film 508, and in this embodiment, tungsten (W) film is employed.

The combination of the materials of the first conductive film 508 and the second conductive film 511 is not limited to the one shown in this embodiment. For example, the first conductive film 508 may be formed from silicon doped with an impurity that imparts N-type conductivity, and the second conductive film 511 may be formed from NiSi (nickel silicide). Alternatively, the first conductive film 508 may be formed from Si doped with an impurity that imparts N-type conductivity, and the second conductive film 511 may be formed from $WSi_x$.

Figure 10A:
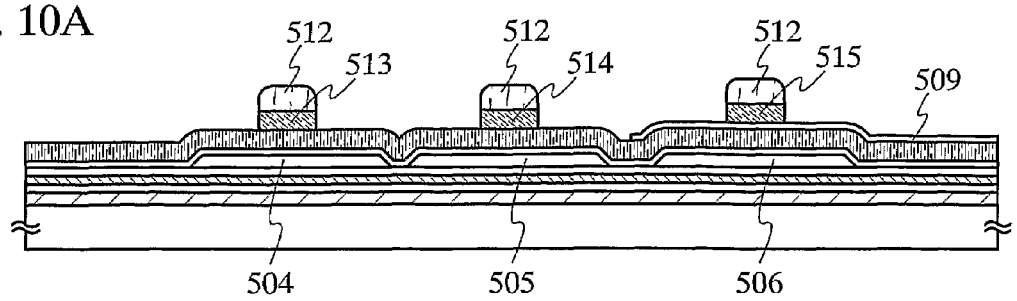
FIGS. 10A to 10E are diagrams showing a manufacturing method of a semiconductor device of the invention.

Then, as shown in FIG. 10A, a mask 512 is formed over the second conductive film 511 to etch the second conductive film 511. As the result of the etching, electrodes 513 to 515 overlapping the island shape semiconductor films 504 to 506 respectively are formed from the second conductive film 511. The second conductive film 511 formed from tungsten can be etched by using a mixed gas of $CF_4$, $Cl_2$ and $O_2$, or $SF_6$, $Cl_2$ and $O_2$. According to this etching, the etch selectivity of the first conductive film 508 relative to the second conductive film 511 can be 5 or more.

Figure 10B:
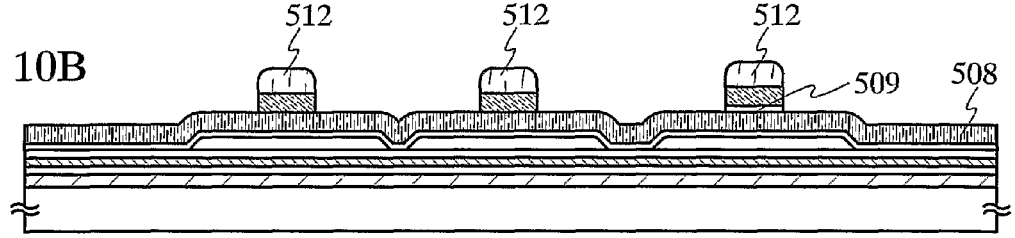

As shown in FIG. 10B, the second gate insulating film 509 is etched again by using the mask 512. When this etching is performed by dry etching using $CHF_3$, the etch selectivity of the second gate insulating film 509 formed from silicon oxide relative to the first conductive film 508 formed from tantalum nitride or tantalum can be 10 or more. The same etch selectivity can be achieved by wet etching using hydrofluoric acid.

Figure 10C:
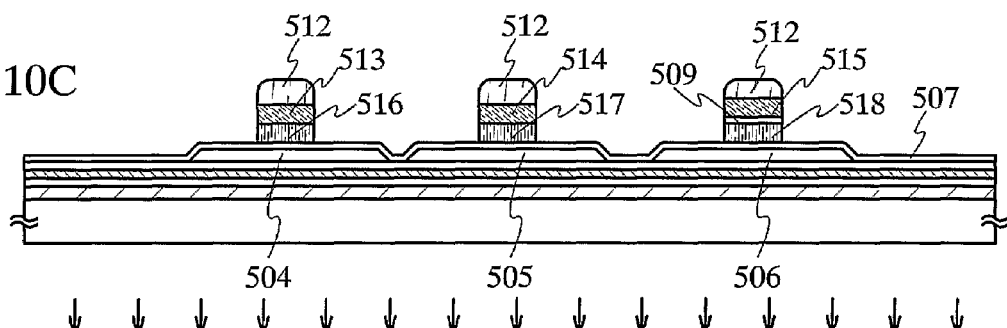

As shown in FIG. 10C, the first conductive film 508 is etched by using the mask 512, thereby electrodes 516 to 518 overlapping the island shape semiconductor films 504 to 506 respectively are formed. If the first conductive film 508 is formed from tantalum nitride or tantalum, the etch selectivity of the first conductive film 508 relative to the first gate insulating film 507 formed from silicon oxide can be 10 or more by using $Cl_2$ as etching gas.

The electrode 513 and the electrode 516 overlap so as to be in contact with each other, and function as a gate electrode. The electrode 514 and the electrode 517 overlap so as to be in contact with each other, and function as a gate electrode. The electrode 515 and the electrode 518 overlap each other with the second gate insulating film 509 interposed therebetween, and the electrode 515 functions as a floating gate whereas the electrode 518 functions as a control gate.

A mask of silicon oxide or the like may be used as the mask 512. In this case, a patterning step of the mask of silicon oxide, silicon oxynitride or the like (referred to as a hard mask) is additionally required, while the mask film is less decreased in etching as compared with the case of using a resist mask, thereby the electrodes 513 to 518 with a desired width can be formed. Alternatively, the electrodes 513 to 518 may be selectively formed by droplet discharging without using the mask 512. In such a case, the second gate insulating film 509 can be etched using the electrode 515 as a mask.

As for the materials of the first conductive film 508 and the second conductive film 511, various kinds of materials can be selected depending on the function thereof. For example, when a conductive wire used as an antenna is formed from the first conductive film 508 and the second conductive film 511 additionally to the electrodes 513 to 518, the materials of the first conductive film 508 and the second conductive film 511 may be selected in consideration of their functions.

Figure 10D:
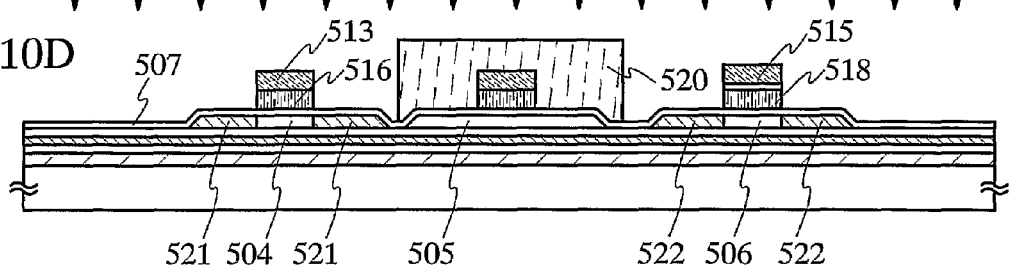

Subsequently, as shown in FIG. 10D, the mask 512 is removed. Then, an N-type impurity element (typically, P (phosphorous) or As (arsenic)) is doped to the island shape semiconductor films 504 and 506 at a low concentration with the electrodes 513, 515, 516, and 518 used as masks while covering the island shape semiconductor film 505 to be a P-channel TFT with a mask 520 (a first doping step). The first doping step is performed under such conditions as a dosage of $1\times10^{13}$ to $6\times10^{13}/cm^2$ and an accelerated voltage of 50 to 70 kV, though the invention is not limited to these. In the first doping step, doping is performed through the first gate insulating film 507 to form a pair of low concentration impurity regions 521 and 522 in the island shape semiconductor films 504 and 506 respectively. Note that the first doping step may be performed without covering the island shape semiconductor film 505 to be a P-channel TFT with the mask 520.

Figure 10E:
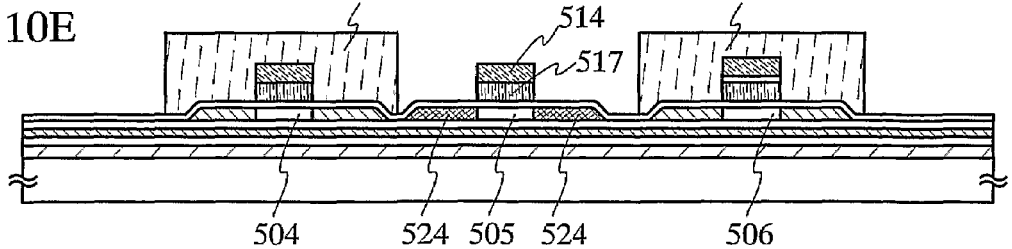

After the mask 520 is removed by ashing or the like, masks 523 are formed so as to cover the island shape semiconductor films 504 and 506 to be N-channel TFTs as shown in FIG. 10E. A P-type impurity element (typically, B (boron)) is doped to the island shape semiconductor film 505 at a high concentration with the electrodes 514 and 517 used as masks (a second doping step). The second doping step is performed under such conditions as a dosage of $1\times10^{16}$ to $3\times10^{16}/cm^2$ and an accelerated voltage of 20 to 40 kV. In the second doping step, doping is performed through the first gate insulating film 507 to form a pair of P-type high concentration impurity regions 524 in the island shape semiconductor film 505.

Figure 11A:
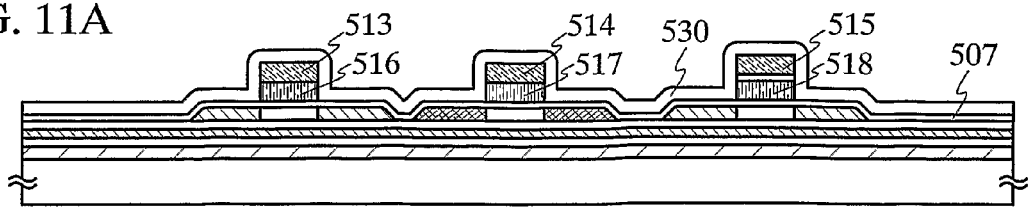
FIGS. 11A to 11E are diagrams showing a manufacturing method of a semiconductor device of the invention.
Figure 11B:
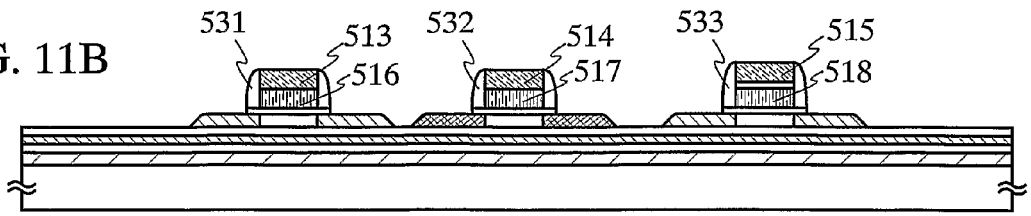

After the masks 523 are removed by ashing or the like, an insulating film 530 is formed so as to cover the first gate insulating film 507 and the electrodes 513 to 518 as shown in FIG. 11A. In this embodiment, a silicon oxide film with a thickness of 100 nm is formed by plasma CVD. Then, the insulating film 530 and the first gate insulating film 507 are partially etched by etch back, thereby sidewalls 531 to 533 are formed in a self-aligned manner so as to be in contact with sidewalls of the electrodes 513 to 518 as shown in FIG. 11B. As etching gas, a mixed gas of $CHF_3$ and He is employed. Note that the forming steps of the sidewalls are not limited to these.

If an insulating film is formed on the opposite surface of the first substrate 500 as well when forming the insulating film 530, the insulating film on the opposite surface may be selectively etched using a resist to be removed. The resist used in this case may be removed by etching with the insulating film 530 and the first gate insulating film 507 when forming the sidewalls 531 to 533 by etch back.

Figure 11C:
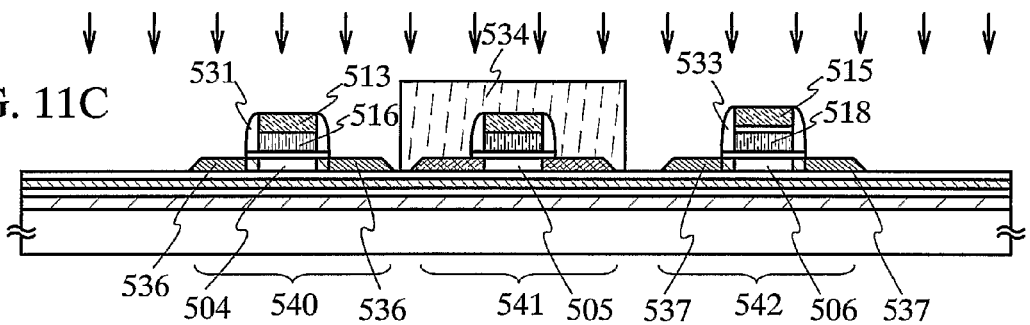

Subsequently, as shown in FIG. 11C, another mask 534 is formed so as to cover the island shape semiconductor film 505 to be the P-channel TFT. Then, an N-type impurity element (typically, P or As) is doped at a high concentration with the gate electrodes 513 and 516 and the sidewall 531, and the gate electrodes 515 and 518 and the sidewall 533 used as masks (a third doping step). The third doping step is performed under such conditions as a dosage of $1\times10^{13}$ to $5\times10^{15}/cm^2$ and an accelerated voltage of 60 to 100 kV. In the third doping step, pairs of N-type high concentration impurity regions 536 and 537 are formed in the island shape semiconductor films 504 and 506 respectively.

The sidewalls 531 and 533 serve as masks when an N-type impurity is doped at a high concentration in the subsequent step to form a low concentration impurity region or a non-doped offset region under the sidewalls 531 and 533. Accordingly, in order to adjust the width of the low concentration impurity region or the offset region, the conditions of the etch back for forming the sidewalls 531 and 533 or the thickness of the insulating film 530 may be changed arbitrarily to adjust the size of the sidewalls 531 and 533.

After the mask 534 is removed by ashing or the like, thermal activation of the impurity regions may be performed. For example, a silicon oxynitride film with a thickness of 50 nm is formed, and then heat treatment is performed at a temperature of 550° C. for four hours in a nitrogen atmosphere.

Alternatively, it is also possible that a silicon nitride film containing hydrogen is formed to have a thickness of 100 nm and heat treatment is performed at a temperature of 410° C. for one hour in a nitrogen atmosphere, thereby the island shape semiconductor films 504 to 506 are hydrogenated. Further alternatively, the island shape semiconductor films 504 to 506 may be hydrogenated by heat treatment at a temperature of 300 to 450° C. for 1 to 12 hours in a hydrogen atmosphere. As another hydrogenation means, plasma hydrogenation (using hydrogen excited by plasma) may be performed as well. This hydrogenation step allows a dangling bond to be terminated by thermally excited hydrogen. After the semiconductor elements are attached to a flexible second substrate 559 in the subsequent step, defects may occur in the semiconductor film by bending the second substrate 559. Even in such a case, the defects can be terminated by hydrogen contained in the semiconductor film when the semiconductor film contains hydrogen at a concentration of $1\times10^{19}$ to $1\times10^{22}$ atoms/cm$^3$, and more preferably $1\times10^{19}$ to $5\times10^{20}$ atoms/cm$^3$. Instead, the semiconductor film may contain halogen in order to terminate the defects.

Through the aforementioned steps, an N-channel TFT 540, a P-channel TFT 541, and an N-channel TFT 542 are obtained. When the size of the sidewalls is adjusted by changing the conditions of the etch back or the thickness of the insulating film 530 arbitrarily in the aforementioned manufacturing steps, a TFT with a channel length of 0.2 to 2 μm can be formed.

A passivation film may further be formed thereafter in order to protect the TFTs 540 to 542. The passivation film prevents an alkaline metal and an alkaline earth metal from entering the TFTs 540 to 542. The passivation film is desirably formed from silicon nitride, silicon nitride oxide, aluminum nitride, aluminum oxide, silicon oxide or the like. Specifically, for example, a silicon oxynitride film with a thickness of about 600 nm can be used as the passivation film. In this case, the hydrotreatment step may be performed after the formation of the silicon oxynitride film. In this manner, the TFTs 540 to 542 are covered with a three-layer insulating film where a silicon oxynitride film, a silicon nitride film, and a silicon oxynitride film are stacked in this order, though the structure and material thereof are not limited to these. According to the aforementioned structure, the TFTs 540 to 542 are covered with the base film 502 and the passivation film. Accordingly, it is possible to further prevent an alkaline metal such as Na or an alkaline earth metal from diffusing into the semiconductor films used for the semiconductor elements and adversely affecting characteristics of the semiconductor elements.

Figure 11D:
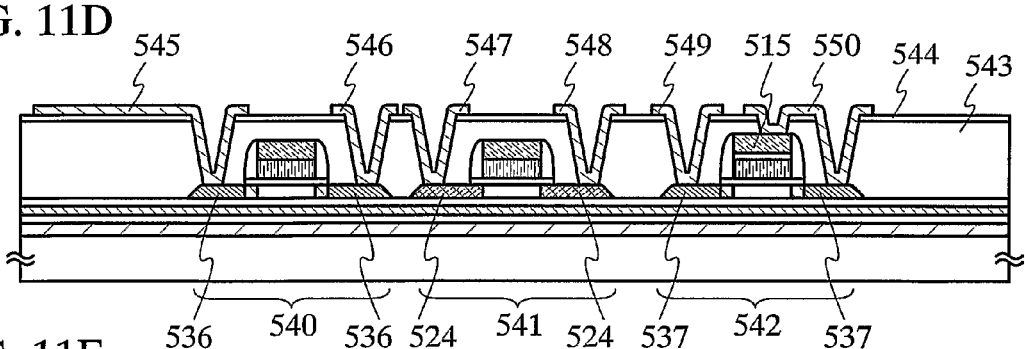

Subsequently, as shown in FIG. 11D, a first interlayer insulating film 543 is formed so as to cover the TFTs 540 to 542. The first interlayer insulating film 543 can be formed of a heat resistant organic resin such as polyimide, acrylic and polyamide as well as a low dielectric constant material (low-k material), a material including siloxane and the like. A resin including siloxane may have an organic group containing at least hydrogen (such as an alkyl group or aromatic hydrocarbon) as a substituent. Alternatively, a fluoro group may be used as the substituent. Further alternatively, a fluoro group and an organic group containing at least hydrogen may be used as the substituent. The first interlayer insulating film 543 can be formed by spin coating, dipping, spray application, droplet discharging (inkjet printing, screen printing, offset printing or the like), a doctor knife, a roll coater, a curtain coater, a knife coater, or the like. Alternatively, an inorganic material may be employed such as silicon oxide, silicon nitride, silicon oxynitride, PSG (phosphorus glass), BPSG (boron phosphorus glass), and alumina. Note that these insulating films may be stacked to form the first interlayer insulating film 543 as well.

In this embodiment, a second interlayer insulating film 544 is formed over the first interlayer insulating film 543. The second interlayer insulating film 544 can be formed of a film containing carbon such as DLC (Diamond Like Carbon) and carbon nitride (CN), a silicon oxide film, a silicon nitride film, a silicon nitride oxide film, or the like. The second interlayer insulating film 544 can be formed by plasma CVD, atmospheric pressure plasma, or the like. Alternatively, a photosensitive or nonphotosensitive organic material such as polyimide, acrylic, polyamide, resist, and benzocyclobutene, or a resin including siloxane may be employed.

Note that a filler may be mixed into the first interlayer insulating film 543 or the second interlayer insulating film 544 in order to prevent these films from being peeled off or cracked due to stress generated by a difference of a thermal expansion coefficient between the first interlayer insulating film 543 or the second interlayer insulating film 544 and a conductive material or the like of a wiring formed later.

Then, contact holes are formed in the first interlayer insulating film 543 and the second interlayer insulating film 544 to form wirings 545 to 550 connected to the TFTs 540 to 542. A mixed gas of $CHF_3$ and He is employed as etching gas for forming the contact holes, though the invention is not limited to this. In this embodiment, the wirings 545 to 550 are formed from Al. Instead, the wirings 545 to 550 may have a five-layer structure of Ti, TiN, Al—Si, Ti, and TiN that are stacked in this order from the substrate side by sputtering.

By mixing Si into the Al layer, hillock can be prevented from generating in the resist baking when the wiring is patterned. Instead of Si, Cu of about 0.5% may be mixed. In addition, by sandwiching the Al—Si layer between Ti and TiN, hillock resistance can be further improved. In the patterning, the aforementioned hard mask of silicon oxynitride or the like is desirably employed. Note that the material and the forming method of the wirings are not limited to these, and the aforementioned material for forming the gate electrode may be employed as well.

The wirings 545 and 546 are connected to the high concentration impurity regions 536 of the N-channel TFT 540, the wirings 547 and 548 are connected to the high concentration impurity regions 524 of the P-channel TFT 541, and the wirings 549 and 550 are connected to the high concentration impurity regions 537 of the N-channel TFT 542. Further, the wiring 550 is connected to the electrode 515 of the N-channel TFT 542.

Figure 11E:
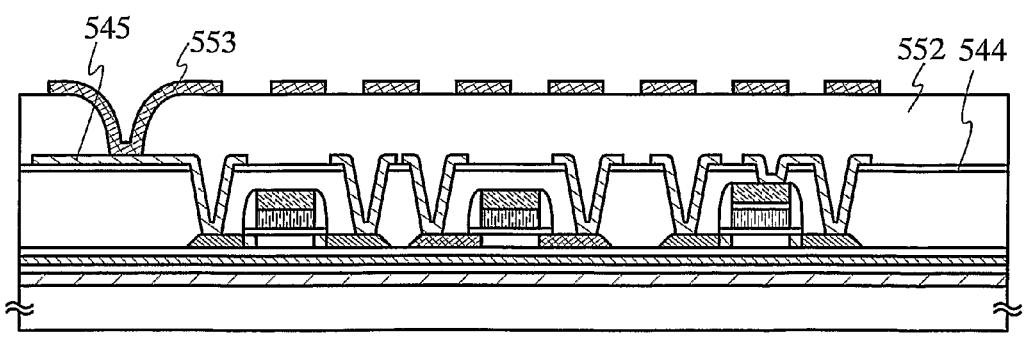

Next, as shown in FIG. 11E, a third interlayer insulating film 552 is formed over the second interlayer insulating film 544 so as to cover the wirings 545 to 550. The third interlayer insulating film 552 has an opening so as to expose a part of the wiring 545. The third interlayer insulating film 552 can be formed from an organic resin film, an inorganic insulating film, or a siloxane insulating film. The organic resin film includes acrylic, polyimide, polyamide and the like, and the inorganic insulating film includes silicon oxide, silicon nitride oxide and the like. A mask used for forming the opening by photolithography can be formed by droplet discharging or printing. Instead, the third interlayer insulating film 552 itself can also be formed by droplet discharging or printing.

An antenna 553 is formed over the third interlayer insulating film 552. The antenna 553 can be formed from a conductive material containing one or more of metals such as Ag, Au, Cu, Pd, Cr, Mo, Ti, Ta, W, Al, Fe, Co, Zn, Sn, and Ni or metal compounds thereof. The antenna 553 is connected to the wiring 545. Although the antenna 553 is connected directly to the wiring 545 in FIG. 11E, the ID chip of the invention is not limited to this configuration. For example, the antenna 553 and the wiring 545 may be electrically connected using a wiring provided separately.

The antenna 553 can be formed by photolithography, plating, vapor deposition, droplet discharging or the like. In this embodiment, the antenna 553 is formed from a single layer conductive film, though it may also be formed by stacking a plurality of conductive films.

When the antenna 553 is formed by printing or droplet discharging, it can be formed without using an exposure mask. In addition, materials are not removed by etching differently from photolithography. Moreover, an expensive exposure mask is not required to be used, resulting in reduced cost of manufacturing ID chips.

Droplet discharging or printing can be performed using, for example, conductive particles obtained by coating Cu with Ag. If the antenna 553 is formed by droplet discharging, the surface of the third interlayer insulating film 552 is desirably processed so as to increase the adhesiveness of the antenna 553.

A method of increasing the adhesiveness specifically includes: a method of attaching to the surface of the third interlayer insulating film 552 a metal or a metal compound for increasing the adhesiveness of a conductive film or an insulating film by catalysis; a method of attaching to the surface of the third interlayer insulating film 552 an organic insulating film, a metal, or a metal compound with increased adhesiveness to a conductive film or an insulating film; a method of applying plasma treatment to the surface of the third interlayer insulating film 552 in an atmospheric pressure or a reduced pressure to modify the surface; and the like. The metal with increased adhesiveness to a conductive film or an insulating film includes titanium and titanium oxide as well as a 3d transition element such as Sc, Ti, V, Cr, Mn, Fe, Co, Ni, Cu, and Zn. The metal compound includes the oxide, nitride, and oxynitride of these metals. The organic insulating film includes polyimide, a resin including siloxane and the like.

If the metal or the metal compound attached to the third interlayer insulating film 552 has conductivity, the sheet resistance thereof is controlled in order not to prevent normal operation of the antenna 553. Specifically, the metal or the metal compound with conductivity is controlled to have an average thickness of, for example, 1 to 10 nm, or the metal or the metal compound is insulated partially or entirely by oxidization. Alternatively, the metal or the metal compound may be selectively removed by etching except for a region required to have increased adhesiveness. Further alternatively, the metal or the metal compound is not attached to the entire surface of the substrate but selectively attached only to a predetermined region by droplet discharging, printing, sol-gel method and the like. Note that the metal or the metal compound formed on the surface of the third interlayer insulating film 552 is not required to be a completely continuous film and may be dispersed to some extent.

Subsequently, a protective layer 555 is formed over the third interlayer insulating film 552 so as to cover the antenna 553. The protective layer 555 is formed from a material that can protect the TFTs 540 to 542 and the wirings 545 to 550 when removing the peeling layer 501 by etching. For example, the protective layer 555 can be formed by applying a water-soluble or alcohol-soluble resin including epoxy, resin including acrylate, or resin including silicon on the entire surface.

In this embodiment mode, a film formed from a water-soluble resin (a product of TOAGOSEI Co., Ltd.: VL-WSHL10) is spin-coated to have a thickness of 30 μm and exposed to light for two minutes so as to be partially cured, then, exposed its back to UV rays for 2.5 minutes and exposed its surface to UV rays for 10 minutes so as to be fully cured. Thus, the protective layer 555 can be obtained. In the case of stacking a plurality of organic resin films, depending on a used solvent, the plural organic resins may be melted partially or too adhesive when coated or baked. Therefore, if an organic resin soluble in the same solvent is used for each of the third interlayer insulating film 552 and the protective layer 555, an inorganic insulating film (a silicon nitride film, a silicon nitride oxide film, an $AlN_x$ film, or an $AlN_xO_y$ film) is preferably formed so as to cover the third interlayer insulating film 552 in order that the protective layer 555 can be easily removed in the following step.

Figure 12A:
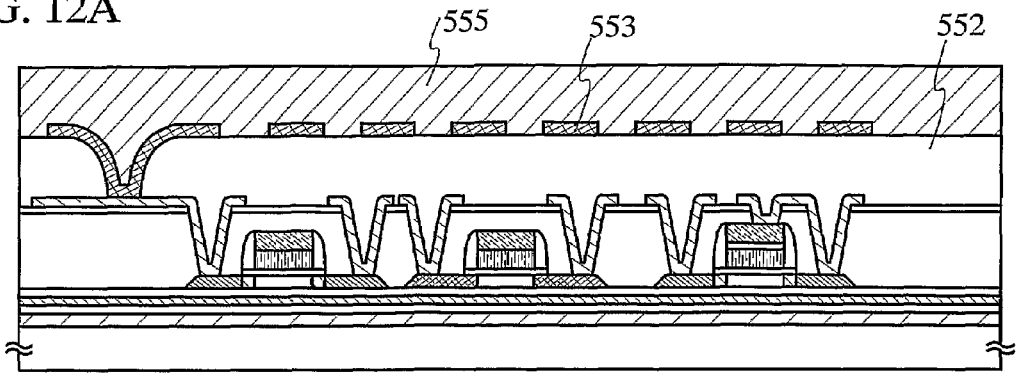
FIGS. 12A to 12C are diagrams showing a manufacturing method of a semiconductor device of the invention.
Figure 12B:
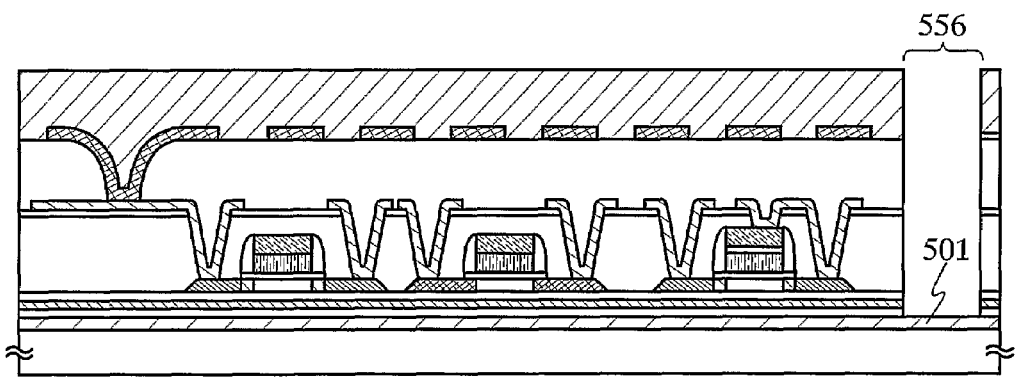

Subsequently, as shown in FIG. 12B, a groove 556 is formed so as to separate ID chips from each other. The groove 556 is only required to have a depth for exposing the peeling layer 501. The groove 556 can be formed by dicing, scribing, photolithography or the like. The groove 556 is not necessarily formed if the ID chip over the first substrate 500 is not required to be separated.

Figure 12C:
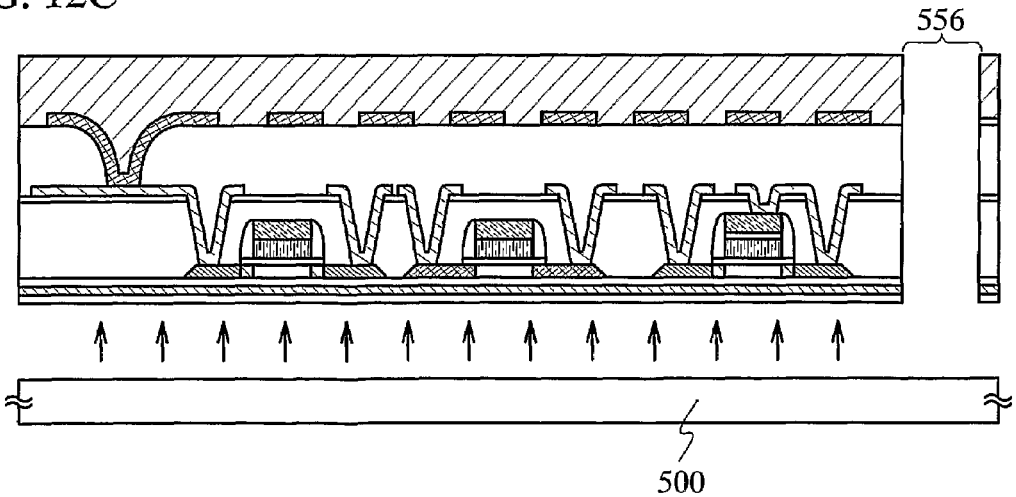

As shown in FIG. 12C, the peeling layer 501 is removed by etching. In this embodiment, halogen fluoride is used as etching gas and introduced into the groove 556. For example, etching may be performed using $ClF_3$ (chlorine trifluoride) at a temperature of 350° C., a flow rate of 300 sccm, and a pressure of 800 Pa for three hours. Alternatively, $ClF_3$ gas mixed with nitrogen may be used as well. The peeling layer 501 can be selectively etched by using halogen fluoride such as $ClF_3$, and thus the first substrate 500 can be peeled off from the TFTs 540 to 542. Note that halogen fluoride may be either a gas or a liquid.

Figure 13A:
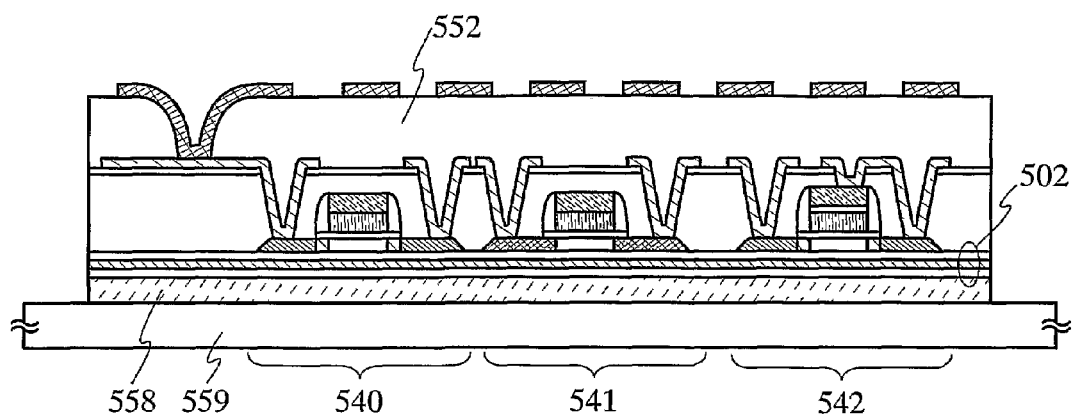
FIGS. 13A and 13B are diagrams showing a manufacturing method of a semiconductor device of the invention.

As shown in FIG. 13A, the peeled TFTs 540 to 542 are attached to a second substrate 559 with an adhesive 558, and then the protective layer 555 is removed. The adhesive 558 is formed from a material capable of attaching the second substrate 559 to the base film 502. For the adhesive 558, for example, various curable adhesives such as a photo-curable adhesive such as a reactive curable adhesive, a heat curable adhesive, and a UV curable adhesive, and an anaerobic adhesive can be employed.

The second substrate 559 can be formed of a glass substrate such as barium borosilicate glass and alumino borosilicate glass, or a flexible organic material such as paper and plastic.

Instead, the second substrate 559 may be formed from a flexible inorganic material. As the plastic substrate, ARTON (product of JSR) formed from polynorbornene having a polar group can be used. It is also possible to use polyester typified by polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), polyimide, acrylonitrile butadiene styrene resin, polyvinyl chloride, polypropylene, polyvinyl acetate, acrylic resin and the like. The second substrate 559 desirably has high thermal conductivity of about 2 to 30 W/mK in order to diffuse the heat generated from a thin film integrated circuit.

Figure 13B:
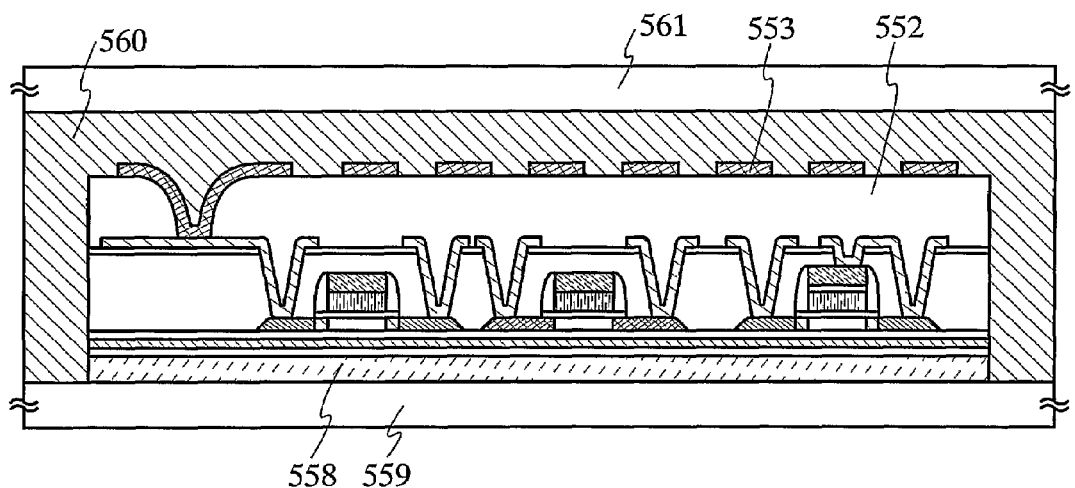

Subsequently, as shown in FIG. 13B, an adhesive 560 is applied on the antenna 553 and the third interlayer insulating film 552, and a cover material 561 is attached thereto. The cover material 561 can be formed of the same material as the second substrate 559. The thickness of the adhesive 560 may be, for example, 10 to 200 µm.

The adhesive 560 is formed from a material capable of attaching the cover material 561 to the antenna 553 and the third interlayer insulating film 552. For the adhesive 560, for example, various curable adhesives such as a photo-curable adhesive such as a reactive curable adhesive, a heat curable adhesive, and a UV curable adhesive, and an anaerobic adhesive can be employed.

Although the cover material 561 is attached to the antenna 553 and the third interlayer insulating film 552 with the adhesive 560 in this embodiment, the invention is not limited to this. The ID chip does not necessarily use the cover material 561. For example, the antenna 553 and the third interlayer insulating film 552 may be covered with resin or the like to increase the mechanical strength of the ID chip. Alternatively, the ID chip may be completed with the step shown in FIG. 13A without using the cover material 561.

The ID chip is completed through the aforementioned steps. According to such a manufacturing method, an integrated circuit significantly reduced in thickness, which has a total thickness of 0.3 to 3 µm, and typically about 2 µm, can be formed between the second substrate 559 and the cover material 561. Note that the thickness of the integrated circuit includes the thickness of each insulating film and interlayer insulating film formed between the adhesive 558 and the adhesive 560 as well as the thickness of the semiconductor element itself, and does not include the thickness of the antenna. The area occupied by the integrated circuit in the ID chip can be made 5 mm square (25 mm$^2$) or less, and more desirably about 0.3 mm square (0.09 mm$^2$) to 4 mm square (16 mm$^2$).

By disposing the integrated circuit as close as possible to the center between the second substrate 559 and the cover material 561, the mechanical strength of the ID chip can be further increased. Specifically, on the assumption that the distance between the second substrate 559 and the cover material 561 is d, the thickness of the adhesive 558 and the adhesive 560 is desirably adjusted so that the distance x between the center in the thickness direction of the integrated circuit and the second substrate 559 may satisfy the following formula 1.

$$\frac{1}{2}d - 30\mu m < x < \frac{1}{2}d + 30\mu m \qquad \text{[Formula 1]}$$

More preferably, the thickness of the adhesive 558 and the adhesive 560 is adjusted so as to satisfy the following formula 2.

$$\frac{1}{2}d - 10\mu m < x < \frac{1}{2}d + 10\mu m \qquad \text{[Formula 2]}$$

Figure 14:
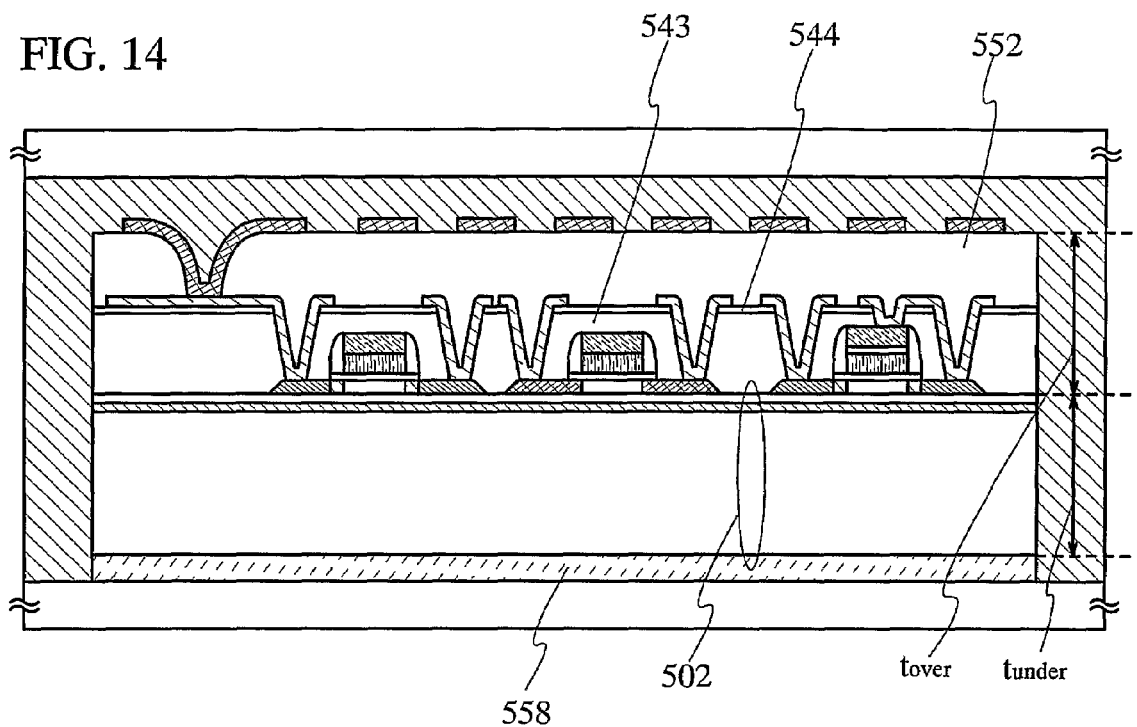
FIG. 14 is a diagram showing a manufacturing method of a semiconductor device of the invention.

In addition, as shown in FIG. 14, the thickness of the base film 502, the first interlayer insulating film 543, the second interlayer insulating film 544, or the third interlayer insulating film 552 in the integrated circuit may be adjusted so that the distance ($t_{under}$) between the island shape semiconductor film of the TFT and the bottom of the base film 502 may be the same or substantially the same as the distance ($t_{over}$) between the island shape semiconductor film and the top of the third interlayer insulating film 552. By disposing the island shape semiconductor film at the center of the integrated circuit in this manner, stress applied to the semiconductor layer can be alleviated, thereby generation of cracks can be prevented.

If the adhesive 558 that is in contact with the base film 502 is formed from organic resin in order to obtain flexibility of the ID chip, when a silicon nitride film or a silicon nitride oxide film is used as the base film 502, an alkaline metal such as Na or an alkaline earth metal can be prevented from diffusing from the organic resin into the semiconductor films.

If the surface of an object is curved and thereby the second substrate 559 of an ID chip attached to the curved surface is curved so as to have a curved surface along a generating line such as a conical surface and a columnar surface, it is preferable to make the direction of the generating line be the same as the moving direction of carriers of the TFTs 540 to 542. According to the such a structure, it can be suppressed that the characteristics of the TFTs 540 to 542 are affected when the second substrate 559 is curved. Moreover, by setting the ratio of the area occupied by the island shape semiconductor film in the integrated circuit to be 1 to 30%, it can be further suppressed that the characteristics of the TFTs 540 to 542 are affected when the second substrate 559 is curved.

In general, an ID chip uses radio waves at a frequency of 13.56 MHz or 2.45 GHz. Therefore, in order to be widely used, the ID chip is required to be formed so as to detect radio waves with these frequencies.

The ID chip of this embodiment has the advantage that radio waves are less shielded as compared with in an ID chip formed by using a semiconductor substrate, thereby signal attenuation due to shielded radio waves can be prevented. Thus, using the glass substrate can make the cost of the ID chip drastically less than using the semiconductor substrate. e.g. the case of using a semiconductor substrate with a diameter of 12 inches is compared with the case of using a glass substrate with a size of 730×920 mm$^2$. The semiconductor substrate has an area of about 73000 mm$^2$ whereas the glass substrate has an area of about 672000 mm$^2$, that is, the glass substrate is about 9.2 times as large as the semiconductor substrate. On the glass substrate with an area of about 672000 mm$^2$, about 672000 ID chips each having an area of 1 mm square can be formed when taking no account of margin for cutting the substrate, which results in forming about 9.2 times as many as the ID chips formed over the semiconductor substrate. In the case of using the glass substrate with a size of 730×920 mm$^2$, which requires fewer manufacturing steps, the amount of capital investment in mass production of ID chips can be reduced to one-third of that in the case of using the semiconductor substrate with a diameter of 12 inches. Further, according to this embodiment, after an integrated circuit is peeled off from a glass substrate, the glass substrate can be reused. Therefore, the cost in the case of using the glass substrate can be significantly reduced as compared with the case of using the semiconductor substrate, even taking into account the cost of repairing a broken glass substrate or cleaning the surface of the glass substrate. In addition, even when the glass substrate is disposed without being reused, the glass substrate with a size of 730×920 mm$^2$ costs about half as much as the semiconductor substrate with a diameter of 12 inches. Thus, significant cost reduction of ID chips can be achieved.

As is evident from the foregoing, an ID chip using a glass substrate with a size of 730×920 mm$^2$ costs only about one-thirtieth as much as an ID chip using a semiconductor substrate with a diameter of 12 inches. Since the ID chip is expected to be used as the disposable one, the ID chip of this embodiment that can cost much less is quite effective for such application.

This embodiment can be implemented in combination with Embodiment mode and Embodiments 1 to 4.

EMBODIMENT 6

Figure 15A:
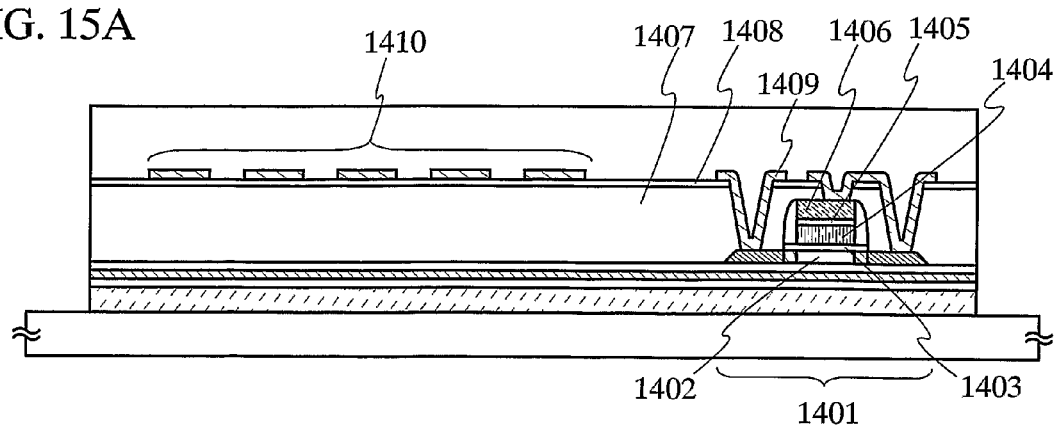
FIGS. 15A and 15B are cross sectional views of a semiconductor device of the invention.

Described with reference to FIG. 15A is a configuration of an ID chip (also called a wireless chip) in the case where a wiring connected to a TFT and an antenna are formed at the same time by patterning a conductive film. FIG. 15A is a cross sectional view of an ID chip of this embodiment.

In FIG. 15A, a TFT 1401 has an island shape semiconductor film 1402, a first gate insulating film 1403 that is in contact with the island shape semiconductor film 1402, and an electrode 1404 overlapping the island shape semiconductor film 1402 with the first gate insulating film 1403 interposed therebetween. The TFT 1401 further has a second gate insulating film 1405 and an electrode 1406 over the electrode 1404, and the electrode 1404 overlaps the electrode 1406 with the second gate insulating film 1405 interposed therebetween.

The TFT 1401 is covered with a first interlayer insulating film 1407 and a second interlayer insulating film 1408. Although the TFT 1401 is covered with the two interlayer insulating films of the first interlayer insulating film 1407 and the second interlayer insulating film 1408 in this embodiment, the invention is not limited to this. The TFT 1401 may be covered with a single interlayer insulating film or three or more interlayer insulating films.

A wiring 1409 formed on the second interlayer insulating film 1408 is connected to the island shape semiconductor film 1402 through a contact hole formed in the first interlayer insulating film 1407 and the second interlayer insulating film 1408.

An antenna 1410 is also formed on the second interlayer insulating film 1408. The wiring 1409 and the antenna 1410 can be formed at the same time by forming a conductive film on the second interlayer insulating film 1408 and patterning the conductive film. By forming the antenna 1410 and the wiring 1409 at the same time, the number of manufacturing steps of the ID chip can be reduced.

Figure 15B:
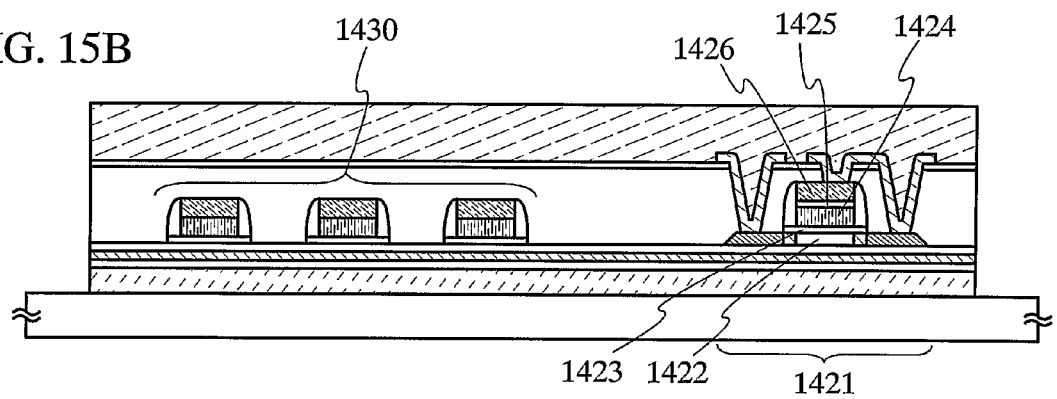

Described with reference to FIG. 15B is a configuration of an ID chip in the case where a gate electrode of a TFT and an antenna are formed at the same time by patterning a conductive film. FIG. 15B is a cross sectional view of an ID chip of this embodiment.

In FIG. 15B, a TFT 1421 has an island shape semiconductor film 1422, a first gate insulating film 1423 that is in contact with the island shape semiconductor film 1422, and an electrode 1424 overlapping the island shape semiconductor film 1422 with the first gate insulating film 1423 interposed therebetween. The TFT 1421 further has a second gate insulating film 1425 and an electrode 1426 over the electrode 1424, and the electrode 1424 overlaps the electrode 1426 with the second gate insulating film 1425 interposed therebetween.

An antenna 1430 is formed over the first gate insulating film 1423. The electrodes 1424 and 1426 and the antenna 1430 can be formed at the same time by forming two conductive films over the first gate insulating film 1423 and patterning the two conductive films. By forming the antenna 1430 and the electrodes 1424 and 1426 at the same time, the number of manufacturing steps of the ID chip can be reduced.

Although the integrated circuit is peeled off from the substrate and attached to another substrate in this embodiment, the invention is not limited to this. The integrated circuit is not necessarily peeled off, if, for example, a heat resistant substrate such as a glass substrate that can withstand a processing temperature during manufacturing steps of the integrated circuit is used.

This embodiment can be implemented in combination with Embodiment mode and Embodiments 1 to 5.

EMBODIMENT 7

Described in this embodiment is a configuration of an ID chip where an integrated circuit is electrically connected to an antenna formed on another substrate.

Figure 16A:
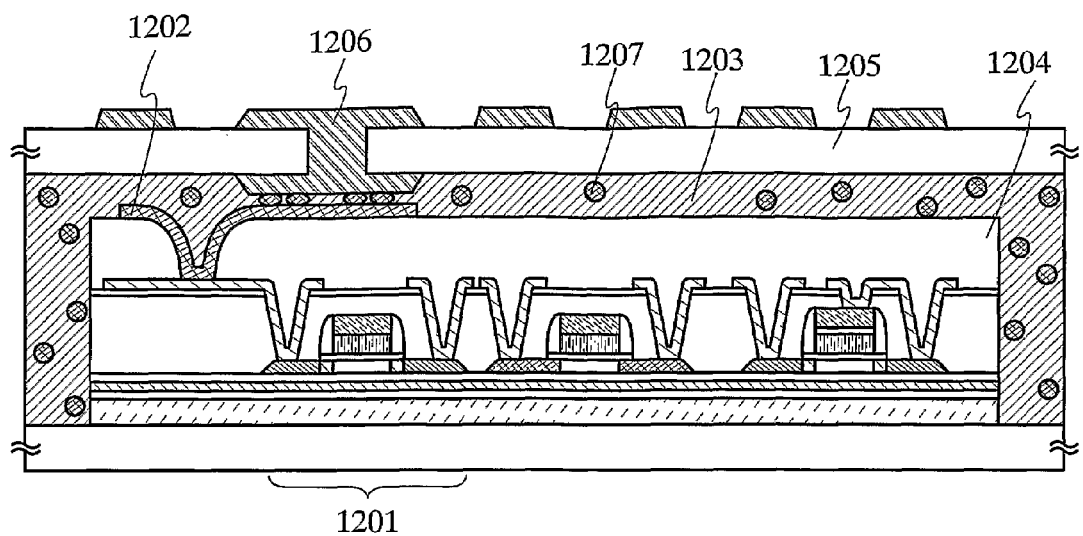
FIGS. 16A and 16B are cross sectional views of a semiconductor device of the invention.

FIG. 16A is a cross sectional view of an ID chip of this embodiment. In FIG. 16A, an adhesive 1203 is applied on a third interlayer insulating film 1204 so as to cover a wiring 1202 electrically connected to a TFT 1201. Then, a cover material 1205 is attached to the third interlayer insulating film 1204 with the adhesive 1203.

An antenna 1206 is formed on the cover material 1205 in advance. In this embodiment, the antenna 1206 is electrically connected to the wiring 1202 by using an anisotropic conductive resin as the adhesive 1203.

The anisotropic conductive resin is a material obtained by dispersing a conductive material 1207 into resin. As the resin, for example, thermal curable resin such as resin including epoxy, resin including urethane, and resin including acrylic, thermoplastic resin such as resin including polyethylene and resin including polypropylene, resin including siloxane and the like can be used. As the conductive material 1207, plastic particles such as polystyrene and epoxy plated with Ni, Au or the like, metal particles such as Ni, Au, Ag, and solder, particulate or fibrous carbon, fibrous Ni plated with Au, and the like can be used. The size of the conductive material is desirably determined depending on the pitch of the antenna 1206 and the wiring 1202.

The anisotropic conductive resin may be pressed between the antenna 1206 and the wiring 1202 by ultrasonic waves, or may be cured by UV irradiation to be pressed.

Although the antenna 1206 is electrically connected to the wiring 1202 with the adhesive 1203 using the anisotropic conductive resin in this embodiment, the invention is not limited to this. Instead of the adhesive 1203, an anisotropic conductive film may be used and pressed to electrically connect the antenna 1206 and the wiring 1202.

Figure 16B:
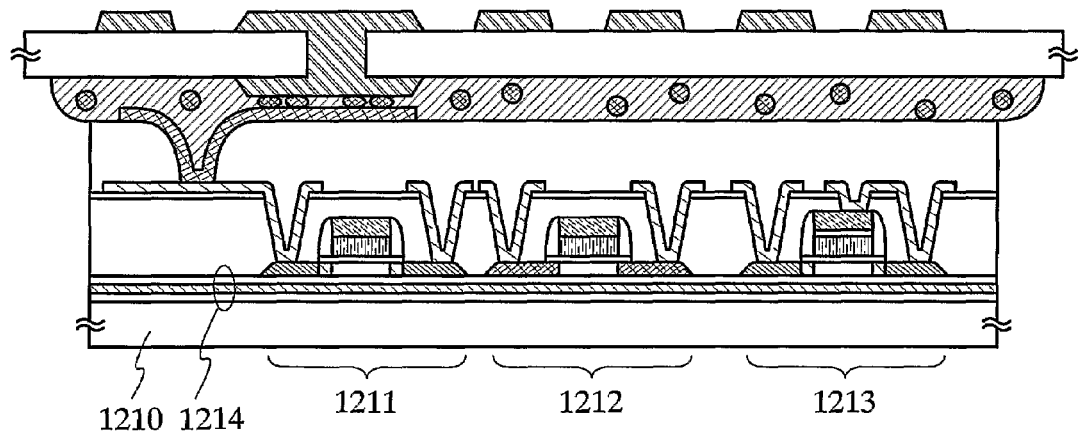

Although the ID chip is formed by peeling off the integrated circuit from the substrate and attaching it to another substrate in this embodiment, the invention is not limited to this. The integrated circuit is not necessarily peeled off, if, for example, a heat resistant substrate such as a glass substrate that can withstand a processing temperature during manufacturing steps of the integrated circuit is used. FIG. 16B is a cross sectional view showing an example of an ID chip formed by using a glass substrate.

In an ID chip shown in FIG. 16B, a glass substrate is used as a substrate 1210, and a base film 1214 is formed between TFTs 1211 to 1213 used for an integrated circuit and the substrate 1210 without an adhesive interposed therebetween.

This embodiment can be implemented in combination with Embodiment mode and Embodiments 1 to 5.

EMBODIMENT 8

Described in this embodiment is a manufacturing method of a plurality of semiconductor devices using a large substrate.

Figure 17A:
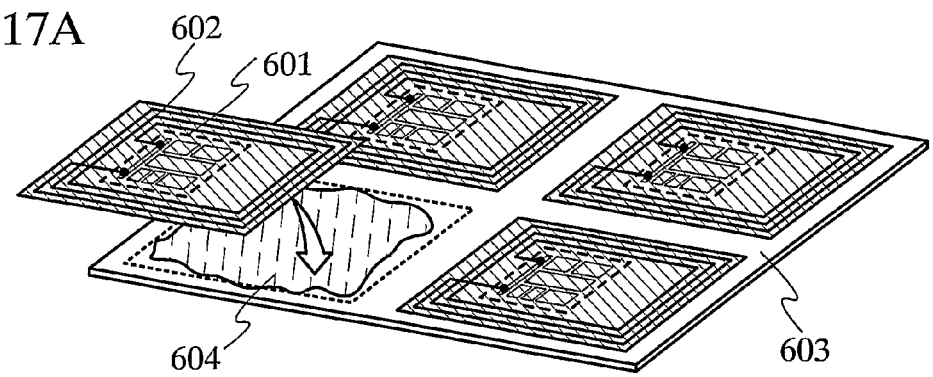
FIGS. 17A to 17D are diagrams showing a manufacturing method of a plurality of semiconductor devices of the invention by using a large substrate.

First, an integrated circuit 601 and an antenna 602 are formed over a heat resistant substrate and peeled off therefrom, then, as shown in FIG. 17A, they are attached to a substrate 603 prepared separately with an adhesive 604. In FIG. 17A, each pair of the integrated circuit 601 and the antenna 602 is attached to the substrate 603, though the invention is not limited to this. A plurality of pairs of the integrated circuit 601 and the antenna 602 may be peeled off while being connected to each other, and then attached to the substrate 603 at a time.

Figure 17B:
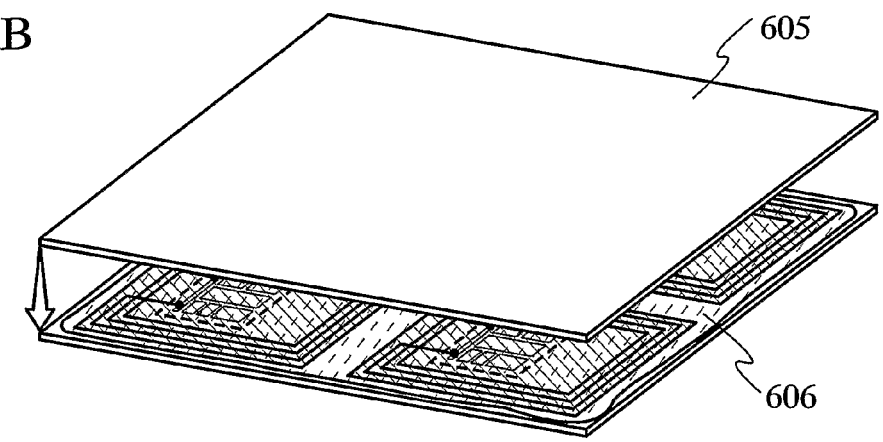
Figure 17C:
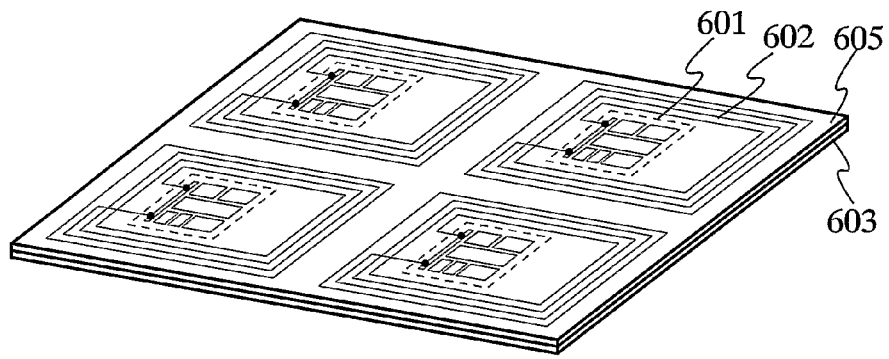

Subsequently, as shown in FIG. 17B, a cover material 605 is attached to the substrate 603 so as to sandwich the integrated circuit 601 and the antenna 602 therebetween. At this time, an adhesive 606 is applied over the substrate 603 so as to cover the integrated circuit 601 and the antenna 602. FIG. 17C shows a state where the cover material 605 is attached to the substrate 603. Note that in FIG. 17C, the integrated circuit 601 and the antenna 602 are shown through the cover material 605 in order to clearly show the position of the integrated circuit 601 and the antenna 602.

Figure 17D:
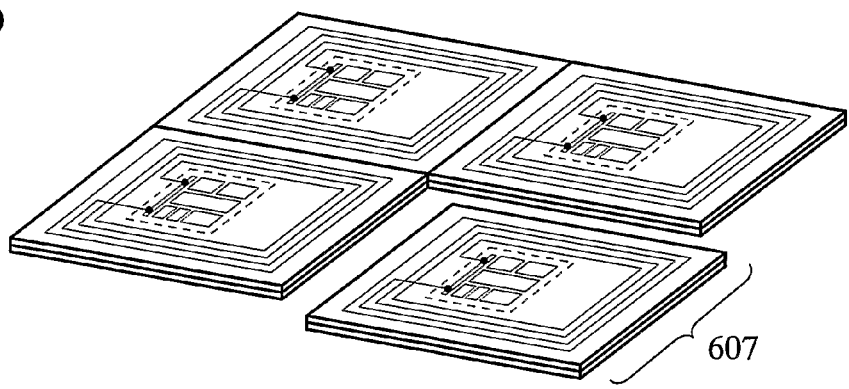

Next, as shown in FIG. 17D, a pair of the integrated circuit 601 and the antenna 602 is separated from each other by dicing or scribing, thereby an ID chip 607 is completed.

Although the antenna 602 and the integrated circuit 601 are simultaneously peeled off in this embodiment, the invention is not limited to this. It is also possible that an antenna is formed over the substrate 603 in advance, and electrically connected to the integrated circuit 601 when attaching the integrated circuit 601. Alternatively, after the integrated circuit 601 is attached to the substrate 603, an antenna may be attached thereto so as to be electrically connected to the integrated circuit 601. Further alternatively, an antenna may be formed over the cover material 605 in advance and electrically connected to the integrated circuit 601 when the cover material 605 is attached to the substrate 603.

An ID chip using a glass substrate can be called an IDG chip (Identification Glass Chip), and an ID chip using a flexible substrate can be called an IDF chip (Identification Flexible Chip).

This embodiment can be implemented in combination with Embodiment 1.

EMBODIMENT 9

If an ID chip that is one of the semiconductor devices of the invention uses a flexible substrate, it is suitably attached to a flexible object or an object having a curved surface. In addition, if an integrated circuit in the ID chip of the invention includes a memory such as a ROM where data cannot be rewritten, it is possible to prevent counterfeiting of an object to which the ID chip is attached. Further, when the ID chip of the invention is used for foods whose commercial value depends crucially on a production area, a producer and the like, forgery of production area, producer and the like can be prevented at low cost.

Specifically, the ID chip of the invention can be attached to a tag having data on the object, such as a shipping tag, a price tag, and a name tag. Instead, the ID chip of the invention itself can be used as a tag. Alternatively, the ID chip of the invention can be attached to a certificate corresponding to a document stating that a fact is true, such as a family register, a resident card, a passport, a driving license, an identification card, a membership card, a survey report, a credit card, a cash card, a prepaid card, a patient's registration card, and a commuter pass. Further alternatively, the ID chip of the invention can be attached to securities corresponding to securities stating private property rights, such as a bill of exchange, a check, a receipt note, a bill of lading, a warehouse receipt, a stock, a bond, a gift certificate, and a mortgage certificate.

Figure 18A:
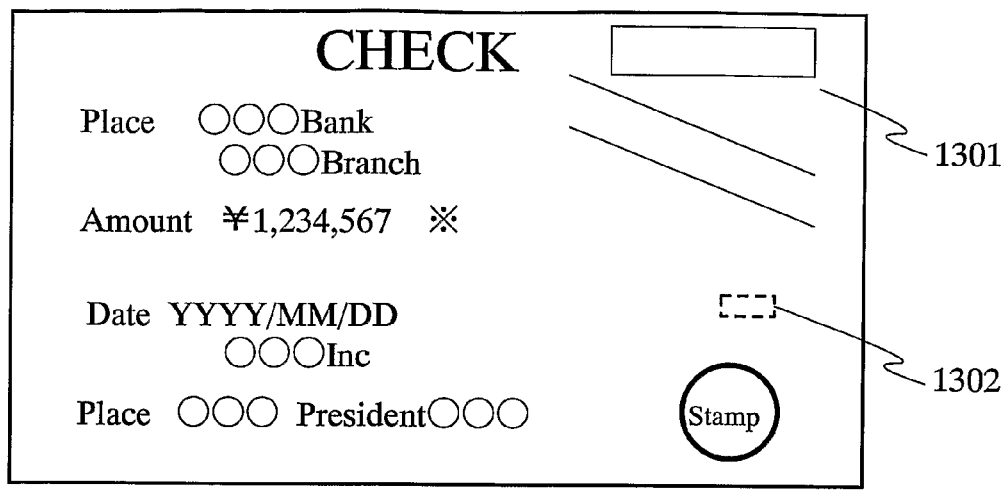
FIGS. 18A to 18C are diagrams showing applications of an ID chip of the invention.

FIG. 18A shows an example of a check 1301 incorporating an ID chip 1302 of the invention. In FIG. 18A, the ID chip 1302 is put inside the check 1301, though it may be exposed outside the check 1301. The ID chip of the invention, if using a flexible substrate, has the advantage that it is not easily broken by stress even when attached to the check 1301 having flexibility.

Figure 18B:
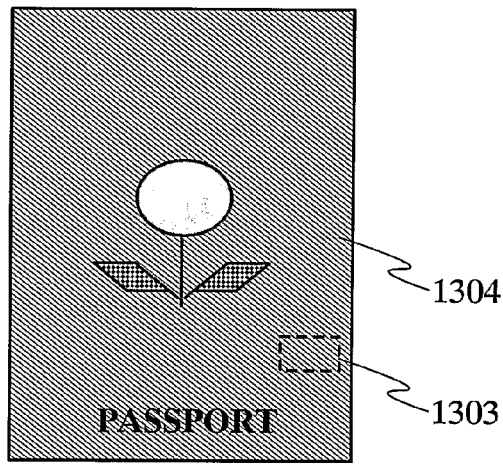

FIG. 18B shows an example of a passport 1304 incorporating an ID chip 1303 of the invention. In FIG. 18B, the ID chip 1303 is put on the cover of the passport 1304, though it may be put on other pages of the passport 1304. The ID chip of the invention, if using a flexible substrate, has the advantage in that it is not easily broken by stress even when attached to the cover of the passport 1304 having flexibility.

Figure 18C:

FIG. 18C shows an example of a gift certificate 1306 incorporating an ID chip 1305 of the invention. The ID chip 1305 may be put inside the gift certificate 1306, or exposed outside the gift certificate 1306. The ID chip of the invention, if using a flexible substrate, has the advantage that it is not easily broken by stress even when attached to the gift certificate 1306 having flexibility.

Since the ID chip of the invention, which uses an integrated circuit having a TFT, is inexpensive and thin, it is effectively used as a disposable chip that is thrown away by a consumer. In particular, a packaging material having the inexpensive and thin ID chip of the invention is quite effective for a product of which sales are affected by a few yens or a few tens of yens has an effect on sales. The packaging material corresponds to a support shapable or shaped to wrap an object, such as plastic wrap, plastic bottle, tray, and capsule.

Figure 19A:
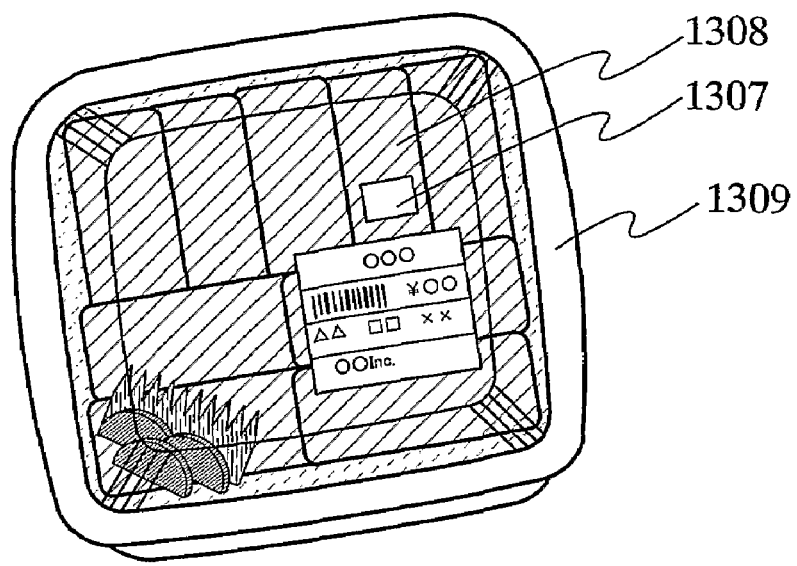
FIGS. 19A and 19B are diagrams showing applications of an ID chip of the invention.

FIG. 19A shows a packed lunch 1309 for sale, which is wrapped in a packaging material 1308 incorporating an ID chip 1307 of the invention. When the price and the like of the article are recorded in the ID chip 1307, the packed lunch 1309 can be paid for at a cash register functioning as a reader/writer. In addition, stock management, expiration date management and the like of the article can also be facilitated.

Instead, the ID chip of the invention may be attached to, for example, a label of the article to perform distribution management of the article using the ID chip.

Figure 19B:
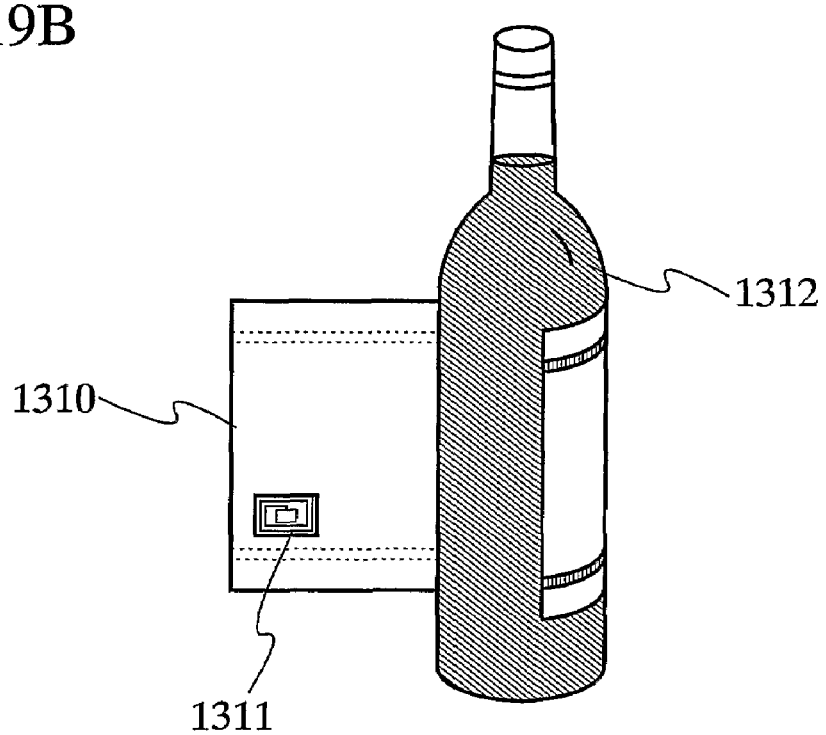
Figure 20A:
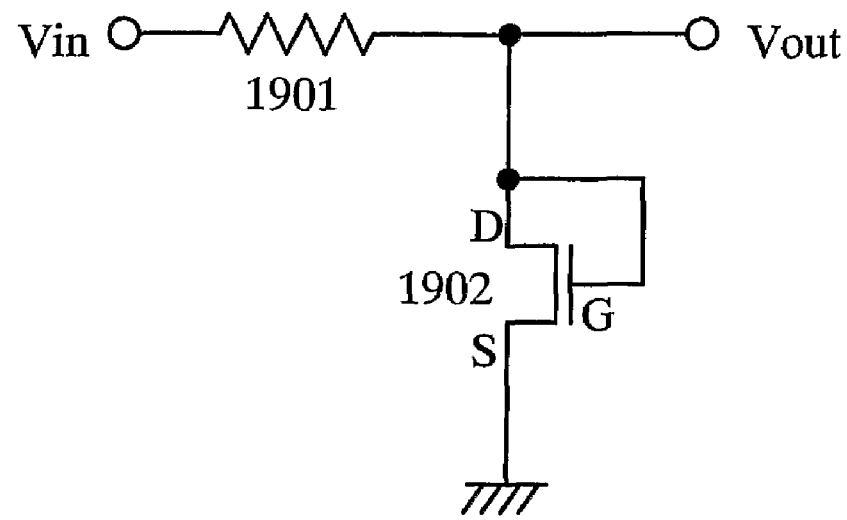
FIG. 20A is a circuit diagram of a general limiter and FIG. 20B is a diagram showing the relation between a drain-source voltage Vds and a drain current Id of a transistor 1902.
Figure 20B:
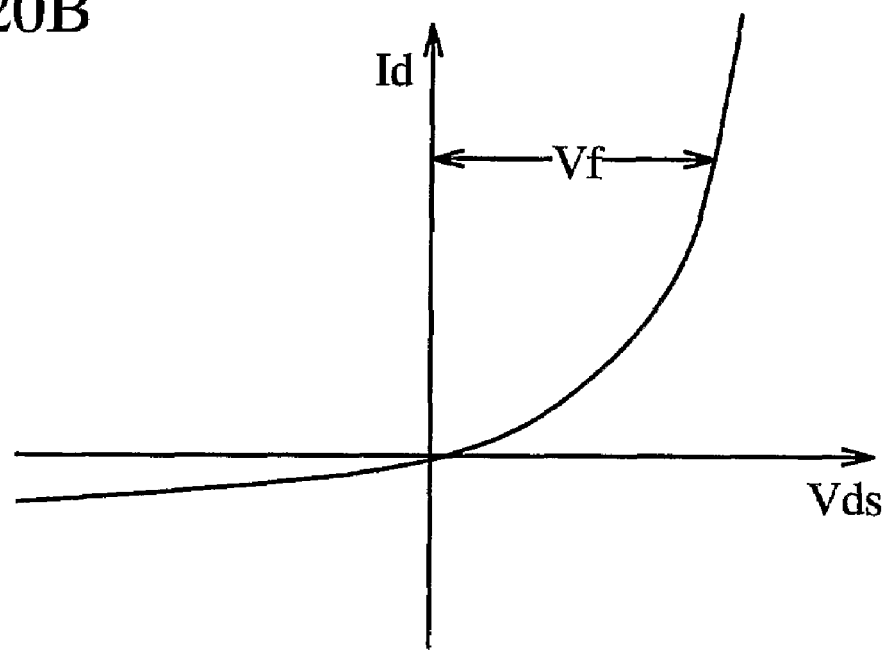

As shown in FIG. 19B, an ID chip 1311 of the invention is attached to a support such as a label 1310 of an article, of which the opposite surface has adhesiveness. The label 1310 to which the ID chip 1311 is attached is put on an article 1312. Identification data on the article 1312 can be read wirelessly from the ID chip 1311 attached to the label 1310. Accordingly, the ID chip 1311 facilitates article management in the distribution process. The ID chip of the invention, if using a flexible substrate, has the advantage that it is not easily broken by stress even when attached to the label 1310 having flexibility. Therefore, the label 1310 using the ID chip of the invention is suitably attached to the object having a curved surface.

For example, if a rewritable nonvolatile memory is used as a memory of an integrated circuit in the ID chip 1311, the distribution process of the article 1312 can be recorded. In addition, when the production process of the product is recorded, a wholesaler, a retailer and a consumer can easily find out a production area, a producer, a date of manufacture, a processing method and the like.

This embodiment can be implemented in combination with at least one of Embodiment Mode and Embodiments 1 to 8.

The present application is based on Japanese Priority Application No. 2004-115467 filed on Apr. 9, 2004 with the Japan Patent Office, the entire contents of which are hereby incorporated by reference.

Explanation of Reference

101: resistor 102: transistor 103: graph 104: graph 201: integrated circuit 202: antenna 203: substrate 204: cover material 205: integrated circuit 206: antenna 207: cover material 208: substrate 301: integrated circuit 302: antenna 303: rectification circuit 304: clock generation circuit 305: demodulation circuit 306: modulation circuit 307: limiter 308: logic circuit portion 401: resistor 402: transistor 403: transistor 411: resistor 412: transistor 413: transistor 421: resistor 422: transistor 423: transistor 431: resistor 432: transistor 433: resistor 441: resistor 442: transistor 443: diode 444: diode 451: resistor 452: transistor 453: operational amplifier 460: limiter 463: pulse generation circuit 464: booster circuit 465: resistor 466: transistor 467: transistor 500: substrate 501: peeling layer 502: base film 503: semiconductor film 504: semiconductor film 505: semiconductor film 506: semiconductor film 507: gate insulating film 508: conductive film 509: gate insulating film 510: mask 511: conductive film 512: mask 513: electrode 514: electrode 515: electrode 516: electrode 517: electrode 518: electrode 520: mask 521: low concentration impurity region 523: mask 524: high concentration impurity region 530: insulating film 531: side wall 533: side wall 534: mask 536: high concentration impurity region 537: high concentration impurity region 540: N-channel TFT 541: P-channel TFT 542: N-channel TFT 543: interlayer insulating film 544: interlayer insulating film 545: wiring 547: wiring 549: wiring 550: wiring 552: interlayer insulating film 553: antenna 555: protective layer 556: groove 558: adhesive 559: substrate 560: adhesive 561: cover material 601:

integrated circuit 602: antenna 603: substrate 604: adhesive 605: cover material 606: adhesive 607: ID chip 1201: TFT 1202: wiring 1203: adhesive 1204: interlayer insulating film 1205: cover material 1206: a conductive material 1207: antenna 1210: substrate 1211: TFT 1214: base film 1301: check 1302: ID chip 1303: ID chip 1304: pass port 1305: ID chip 1306: gift certificate 1307: ID chip 1308: packaging material 1309: packed lunch 1310: label 1311: ID chip 1312: article 1401: TFT 1402: semiconductor film 1403: gate insulating film 1404: electrode 1405: gate insulating film 1406: electrode 1407: interlayer insulating film 1408: interlayer insulating film 1409: wiring 1410: antenna 1421: TFT 1422: semiconductor film 1423: gate insulating film 1424: electrode 1425: gate insulating film 1426: electrode 1430: antenna 1901: resistor 1902: transistor

The invention claimed is:

1. A semiconductor device comprising a limiter, wherein the limiter includes:
a transistor including a semiconductor layer, a floating gate and a control gate,
wherein the floating gate is formed over the semiconductor layer with a first insulating film interposed therebetween;
the floating gate and the control gate of the transistor overlap each other with a second insulating film interposed therebetween;
a side surface of the floating gate is covered with a third insulating film;
a drain of the transistor is connected to the control gate; and
the drain and the control gate are connected to an input terminal and an output terminal,
wherein the floating gate is electrically floating, and
wherein the limiter is configured to change a limit voltage by controlling an amount of charge accumulated in the floating gate by adjusting a control gate voltage and a source voltage of the transistor.

2. The semiconductor device according to claim 1 further comprising a connecting terminal, wherein the connecting terminal is connected to the drain of the transistor.

3. The semiconductor device according to claim 1 further comprising a resistor, wherein the drain of the transistor is connected to the input terminal through the resistor.

4. The semiconductor device according to claim 1, wherein the transistor is a thin film transistor.

5. A semiconductor device comprising a limiter, wherein the limiter includes:
a transistor including a semiconductor layer, a floating gate and a control gate,
wherein the floating gate is formed over the semiconductor layer with a first insulating film interposed therebetween;
the floating gate and the control gate of the transistor overlap each other with a second insulating film interposed therebetween;
a side surface of the floating gate is covered with a third insulating film;
a drain of the transistor is connected to the control gate; and
a source of the transistor is connected to an input terminal and an output terminal,
wherein the floating gate is electrically floating, and
wherein the, limiter is configured to chance a limit voltage by controlling an amount of charge accumulated in the floating gate by adjusting a control gate voltage and a source voltage of the transistor.

6. The semiconductor device according to claim 5 further comprising a connecting terminal, wherein the connecting terminal is connected to the source of the transistor.

7. The semiconductor device according to claim 5 further comprising a resistor, wherein the source of the transistor is connected to the input terminal through the resistor.

8. The semiconductor device according to claim 5, wherein the transistor is a thin film transistor.

9. A semiconductor device comprising a limiter, wherein the limiter includes:
a plurality of transistors each including a semiconductor layer, a floating gate and a control gate,
wherein the floating gate of each of the plurality of transistors is formed over the semiconductor layer of each of the plurality of transistors with a first insulating film interposed therebetween;
the floating gate and the control gate of each of the plurality of transistors overlap each other with a second insulating film interposed therebetween;
a side surface of the floating gate of each of the plurality of transistors is covered with a third insulating film;
a drain of each of the plurality of transistors is connected to the control gate of each of the plurality of transistors;

the plurality of transistors are connected in series so as to have the same forward current direction; and the drain and the control gate of one of the plurality of transistors are connected to an input terminal and an output terminal, wherein the floating gate of each of the plurality of transistors is electrically floating, and wherein the limiter is configured to change a limit voltage by controlling an amount of charge accumulated in at least one of the floating gates by adjusting a control gate voltage and a source voltage of at least one of the transistors.

10. The semiconductor device according to claim 9 further comprising a connecting terminal, wherein the connecting terminal is connected to the drain of the one of the plurality of transistors.

11. The semiconductor device according to claim 9 further comprising a resistor, wherein the drain of the one of the plurality of transistors is connected to the input terminal through the resistor.

12. The semiconductor device according to claim 9, wherein the plurality of transistors are thin film transistors.

13. A semiconductor device comprising a limiter, wherein the limiter includes:

a plurality of transistors each including a semiconductor layer, a floating gate and a control gate, wherein the floating gate of each of the plurality of transistors is formed over the semiconductor layer of each of the plurality of transistors with a first insulating film interposed therebetween;

the floating gate and the control gate of each of the plurality of transistors overlap each other with a second insulating film interposed therebetween;

a side surface of the floating gate of each of the plurality of transistors is covered with a third insulating film;

a drain of each of the plurality of transistors is connected to the control gate of each of the plurality of transistors;

the plurality of transistors are connected in series so as to have the same forward current direction; and a source of one of the plurality of transistors is connected to an input terminal and an output terminal, wherein the floating gate of each of the plurality of transistors is electrically floating, and wherein the limiter is configured to change a limit voltage by controlling an amount of charge accumulated in at least one of the floating gates by adjusting a control gate voltage and a source voltage of at least one of the transistors.

14. The semiconductor device according to claim 13 further comprising a connecting terminal, wherein the connecting terminal is connected to the source of the one of the plurality of transistors.

15. The semiconductor device according to claim 13 further comprising a resistor, wherein the source of the one of the plurality of transistors is connected to the input terminal through the resistor.

16. The semiconductor device according to claim 13, wherein the plurality of transistors are thin film transistors.

17. A semiconductor device comprising a limiter, wherein the limiter includes:

a first transistor, and a second transistor, wherein a floating gate of the first transistor is formed over a semiconductor layer of the first transistor with a first insulating film interposed therebetween;

the floating gate and a control gate of the first transistor overlap each other with a second insulating film interposed therebetween;

a side surface of the floating gate of the first transistor is covered with a third insulating film;

a drain of the first transistor is connected to the control gate of the first transistor;

a drain of the second transistor is connected to a gate of the second transistor;

the first transistor and the second transistor are connected in series so as to have the same forward current direction; and the drain of the second transistor and the control gate are connected to an input terminal and an output terminal, wherein the floating gate of the first transistor is electrically floating, and wherein the limiter is configured to change a limit voltage by controlling an amount of charge accumulated in the floating gate by adjusting a control gate voltage and a source voltage of the first transistor.

18. The semiconductor device according to claim 17 further comprising a connecting terminal, wherein the connecting terminal is connected to the drain of the second transistor.

19. The semiconductor device according to claim 17 further comprising a resistor, wherein the drain of the second transistor is connected to the input terminal through the resistor.

20. The semiconductor device according to claim 17, wherein the second transistor is a thin film transistor.

21. A semiconductor device comprising a limiter, wherein the limiter includes:

a first transistor, and a second transistor, wherein a floating gate of the first transistor is formed over a semiconductor layer of the first transistor with a first insulating film interposed therebetween;

the floating gate and a control gate of the first transistor overlap each other with a second insulating film interposed therebetween;

a side surface of the floating gate of the first transistor is covered with a third insulating film;

a drain of the second transistor is connected to a gate of the second transistor;

the first transistor and the second transistor are connected in series so as to have the same forward current direction; and a source of the second transistor is connected to an input terminal and an output terminal, wherein the floating gate of the first transistor is electrically floating, and wherein the limiter is configured to change a limit voltage by controlling an amount of charge accumulated in the floating gate by adjusting a control gate voltage and a source voltage of the first transistor.

22. The semiconductor device according to claim 21 further comprising a connecting terminal, wherein the connecting terminal is connected to the source of the second transistor.

23. The semiconductor device according to claim 21 further comprising a resistor, wherein the source of the second transistor is connected to the input terminal through the resistor.

24. The semiconductor device according to claim 21, wherein the second transistor is a thin film transistor.

25. A semiconductor device comprising:

an integrated circuit, and an antenna connected to the integrated circuit, wherein the integrated circuit includes a limiter;
the limiter includes a transistor;
a floating gate of the transistor is formed over a semiconductor layer of the transistor with a first insulating film interposed therebetween;
the floating gate and a control gate of the transistor overlap each other with a second insulating film interposed therebetween;
a side surface of the floating gate is covered with a third insulating film;
a drain of the transistor is connected to the control gate; and
the drain and the control gate are connected to an input terminal and an output terminal,
wherein the floating gate is electrically floating, and
wherein the limiter is configured to change a limit voltage by controlling an amount of charge accumulated in the floating gate by adjusting a control gate voltage and a source voltage of the transistor.

26. A semiconductor device comprising an integrated circuit and an antenna connected to the integrated circuit,
wherein the integrated circuit includes a limiter, a pulse generation circuit for controlling a limit voltage of the limiter, and a booster circuit for supplying a power supply voltage to the pulse generation circuit;
the limiter includes a transistor;
a floating gate of the transistor is formed over a semiconductor layer of the transistor with a first insulating film interposed therebetween;
the floating gate and a control gate of the transistor overlap each other with a second insulating film interposed therebetween;
a side surface of the floating gate is covered with a third insulating film;
a drain of the transistor is connected to the control gate; and
the drain and the control gate are connected to an input terminal and an output terminal;
wherein the floating gate is electrically floating, and
wherein the limiter is configured to change the limit voltage by controlling an amount of charge accumulated in the floating gate by adjusting a control gate voltage and a source voltage of the transistor.

27. The semiconductor device according to claim 25 or 26 further comprising a resistor, wherein the drain of the transistor is connected to the input terminal through the resistor.

28. The semiconductor device according to claim 25 or 26, wherein the transistor is a thin film transistor.

* * * * *

UNITED STATES PATENT AND TRADEMARK OFFICE
CERTIFICATE OF CORRECTION

PATENT NO. : 7,714,633 B2
APPLICATION NO. : 10/593577
DATED : May 11, 2010
INVENTOR(S) : Kiyoshi Kato et al.

It is certified that error appears in the above-identified patent and that said Letters Patent is hereby corrected as shown below:

At column 32, line 42, please change "chance" to --change--;

At column 34, line 42, "a drain of the first transistor is connected to the control gate of the first transistor" should be recited before "a drain of the second transistor is connected to a gate of the second transistor".

Signed and Sealed this

Twenty-sixth Day of October, 2010

David J. Kappos
*Director of the United States Patent and Trademark Office*